(12) United States Patent
Nagasaku et al.

(10) Patent No.: US 9,172,331 B2
(45) Date of Patent: Oct. 27, 2015

(54) POWER SUPPLY CIRCUIT

(71) Applicant: HITACHI KOKUSAI ELECTRIC INC., Tokyo (JP)

(72) Inventors: Toshiyuki Nagasaku, Machida (JP); Manabu Nakamura, Akishima (JP); Taizo Ito, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/360,439

(22) PCT Filed: Nov. 19, 2012

(86) PCT No.: PCT/JP2012/079962
§ 371 (c)(1),
(2) Date: May 23, 2014

(87) PCT Pub. No.: WO2013/007290
PCT Pub. Date: May 30, 2013

(65) Prior Publication Data
US 2014/0312970 A1   Oct. 23, 2014

(30) Foreign Application Priority Data
Nov. 25, 2011   (JP) .................. 2011-257502

(51) Int. Cl.
*H03F 3/217*   (2006.01)
*H03F 1/02*   (2006.01)
(Continued)

(52) U.S. Cl.
CPC .............. *H03F 1/025* (2013.01); *H03F 1/0222* (2013.01); *H03F 1/0227* (2013.01); *H03F 3/189* (2013.01);
(Continued)

(58) Field of Classification Search
USPC ......................... 330/10, 251, 207 A, 297, 136
See application file for complete search history.

(56) References Cited

U.S. PATENT DOCUMENTS

| 5,347,230 A | 9/1994 | Noro |
| 7,965,140 B2 * | 6/2011 | Takahashi ..................... 330/136 |

(Continued)

FOREIGN PATENT DOCUMENTS

| JP | S55-121713 A | 9/1980 |
| JP | H04372212 A | 12/1992 |

(Continued)

OTHER PUBLICATIONS

International Search Report for PCT/JP2012/079962, ISA/JP in English and Japanese (4 pages), mailed Feb. 12, 2013.

(Continued)

*Primary Examiner* — Hieu Nguyen
(74) *Attorney, Agent, or Firm* — Harness, Dickey & Pierce, PLC

(57) ABSTRACT

A power supply circuit includes: a push-pull amplifier unit which amplifies an input signal with a push-pull amplification protocol; a variable power supply unit which varies, with a control signal, the voltage level of a power supply voltage which is supplied to the push-pull amplifier; a switch control unit which, on the basis of the input signal, outputs the control signal which controls the voltage level of the power supply voltage; and a timing control unit which applies a specified time delay to the input signal. When the control signal rises, the switch control unit causes the control signal to rise at a faster timing, according to the voltage level switch transition timing, than a delay time upon the timing control unit, and when the control signal falls, the switch control unit causes the control signal to fall at the timing of the delay time.

6 Claims, 15 Drawing Sheets

PUSH-PULL AMPLIFIER USED IN POWER SUPPLY CIRCUIT OF 2ND EMBODIMENT

(51) Int. Cl.
*H03F 3/24* (2006.01)
*H03F 3/189* (2006.01)
*H03F 3/30* (2006.01)

(52) U.S. Cl.
CPC .................. *H03F 3/217* (2013.01); *H03F 3/24* (2013.01); *H03F 3/245* (2013.01); *H03F 3/301* (2013.01); *H03F 3/3016* (2013.01); *H03F 2200/411* (2013.01); *H03F 2200/507* (2013.01); *H03F 2200/511* (2013.01); *H03F 2200/516* (2013.01); *Y02B 60/50* (2013.01)

(56) References Cited

U.S. PATENT DOCUMENTS 8,698,558 B2 * 4/2014 Mathe et al. .................. 330/251
8,766,716 B2 * 7/2014 Paek et al. .................... 330/136
2013/0034250 A1 2/2013 Ozaki et al.

FOREIGN PATENT DOCUMENTS

JP 2006-254345 A 9/2006
WO WO-2011/142139 A1 11/2011

OTHER PUBLICATIONS

Feipeng Wang et al., "An Improved Power-Added Efficiency 19-dBm Hybrid Envelope Elimination and Restoration Power Amplifier for 802.11g WLAN applications," IEEE Transactions on Microwave Theory and Techniques, vol. 54, No. 12, Dec. 2006, pp. 4086-4099.
Geoffrey R. Walker, "A Class B Switch-Mode Assisted Linear Amplifier," IEEE Transactions on Power Electronics, vol. 18, No. 6, Nov. 2003, pp. 1278-1285.

* cited by examiner

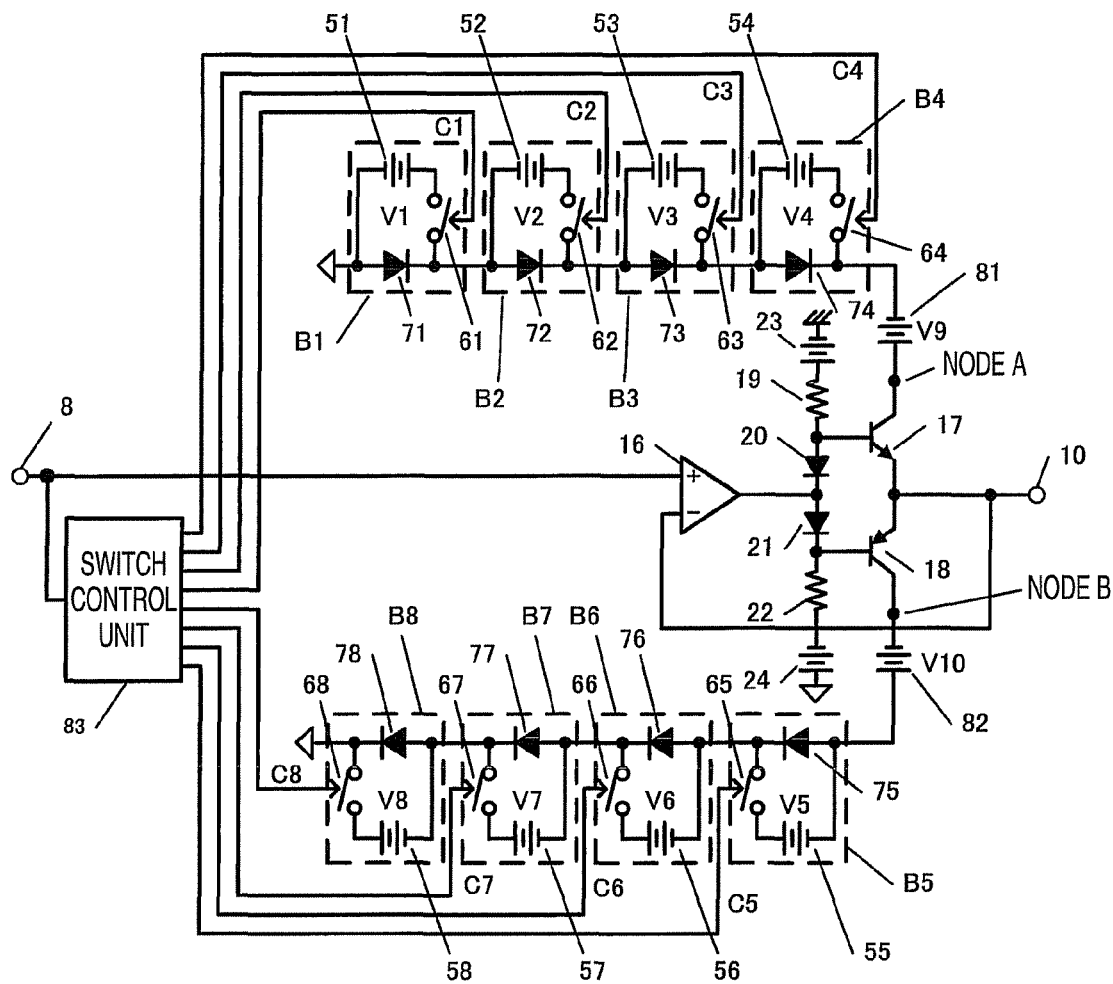
FIG. 1 PUSH-PULL AMPLIFIER USED IN POWER SUPPLY CIRCUIT OF 1ST EMBODIMENT

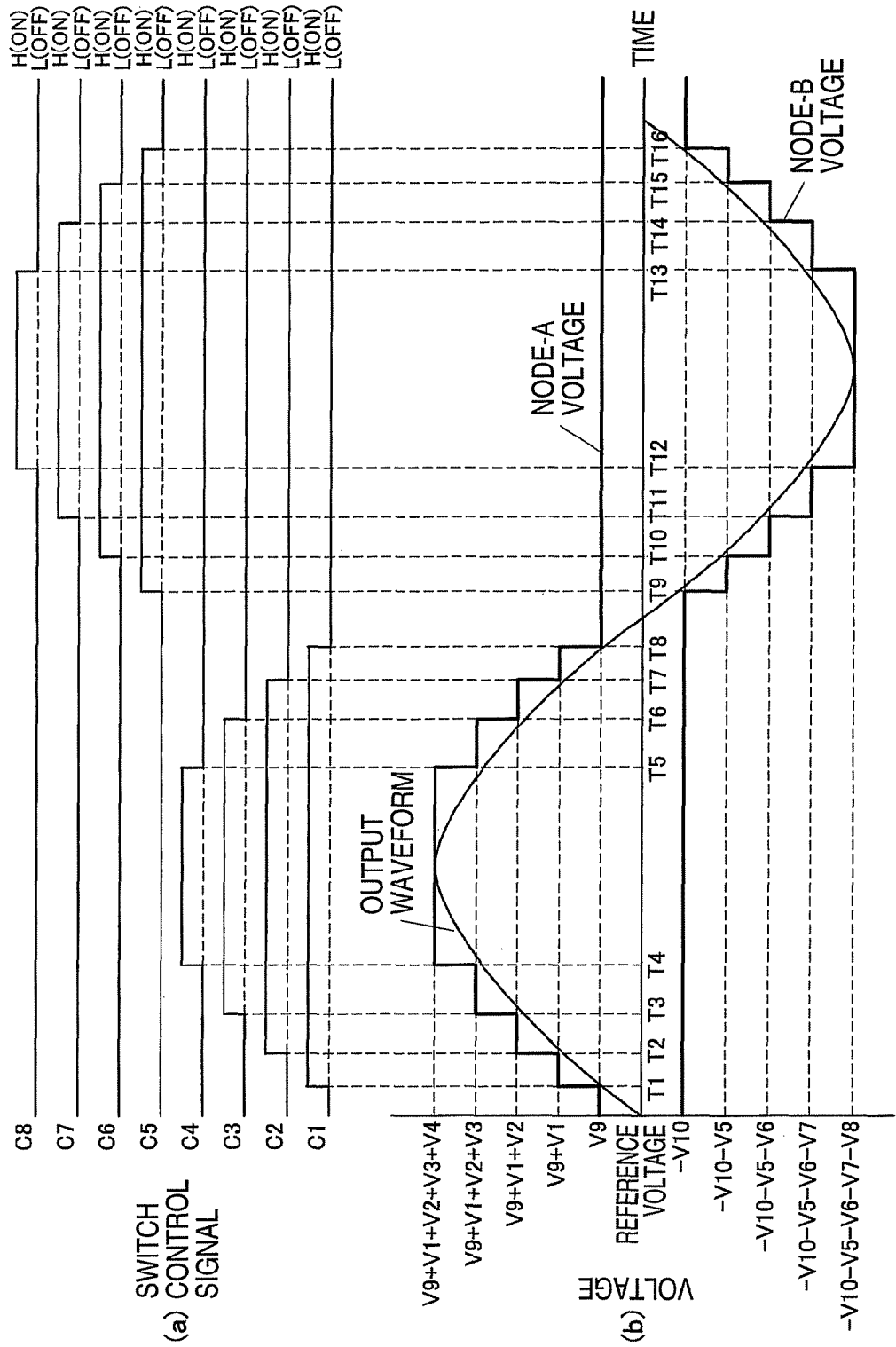
FIG. 2 SWITCH CONTROL SIGNALS AND TRANSISTOR COLLECTOR VOLTAGE OF 1ST PUSH-PULL AMPLIFIER

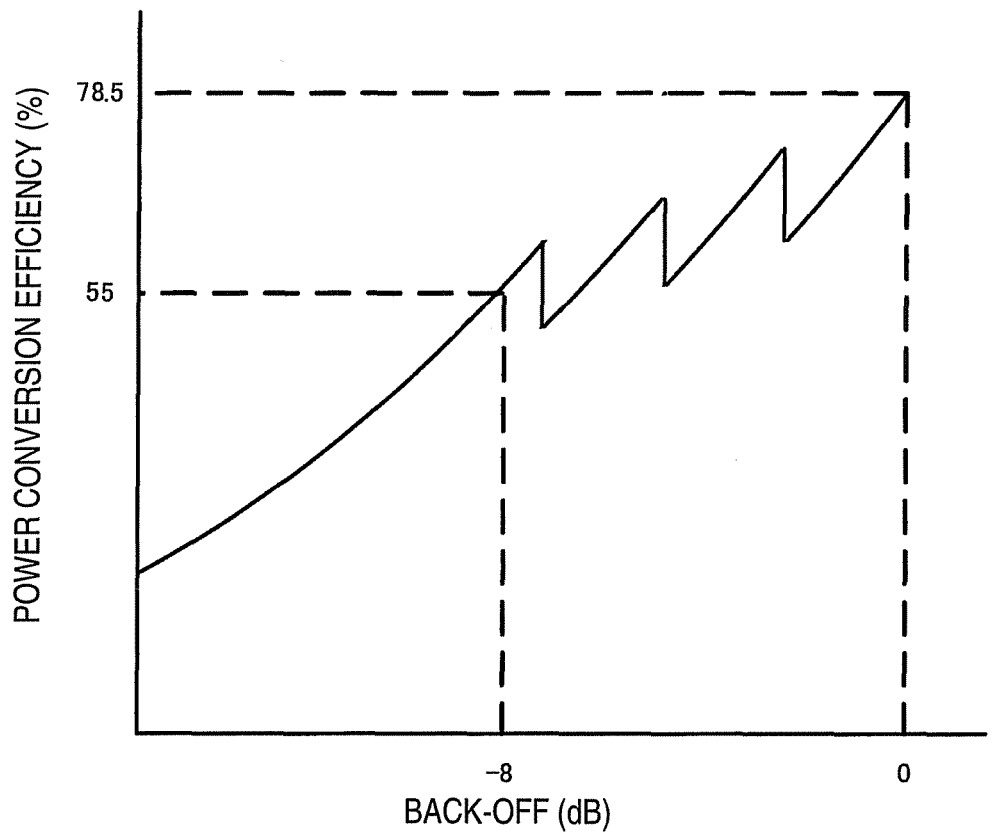
FIG. 3 POWER CONVERSION EFFICIENCY CHARACTERISTICS OF 1ST PUSH-PULL AMPLIFIER

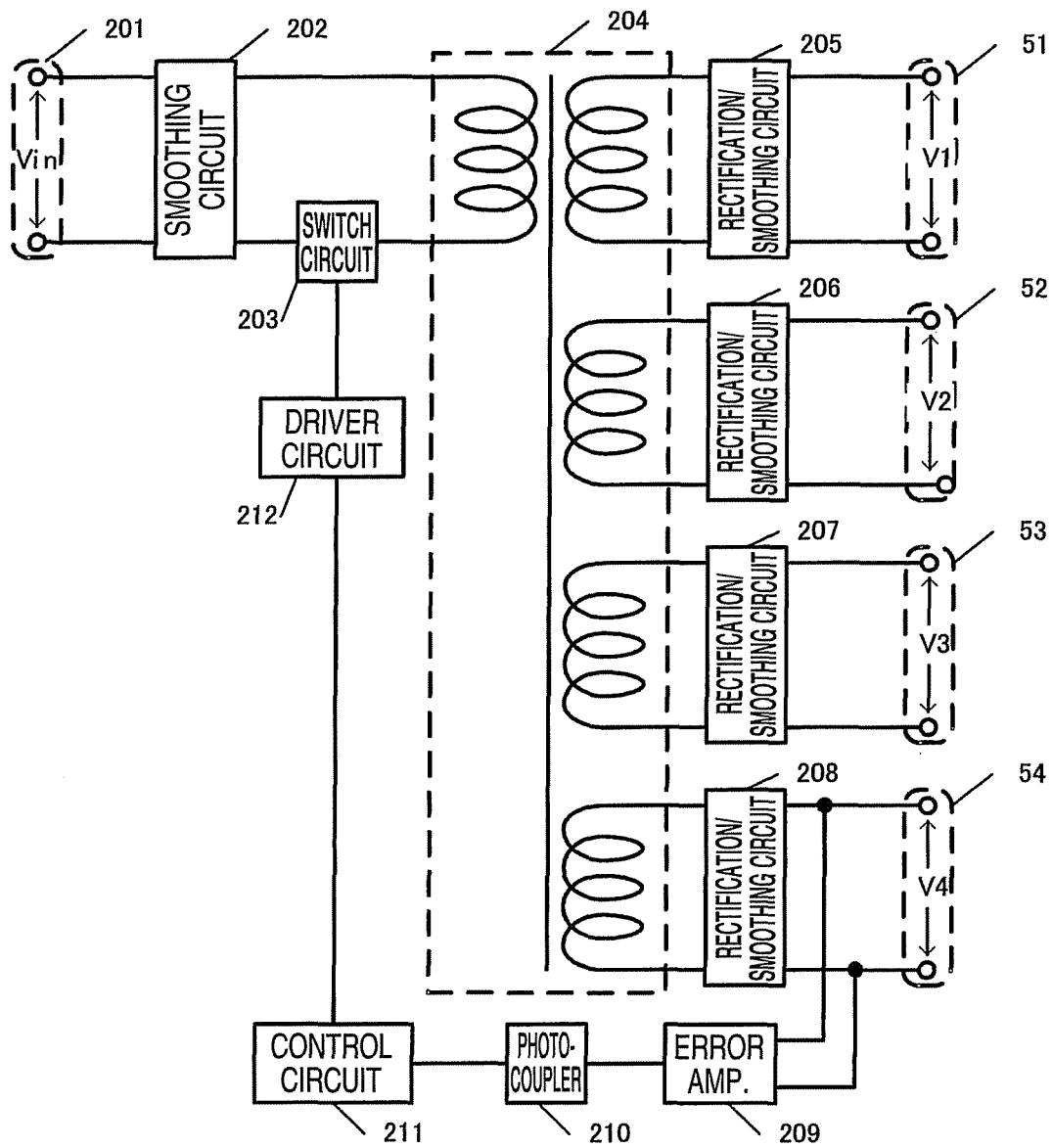
FIG. 4 DC VOLTAGE SOURCE EXAMPLE

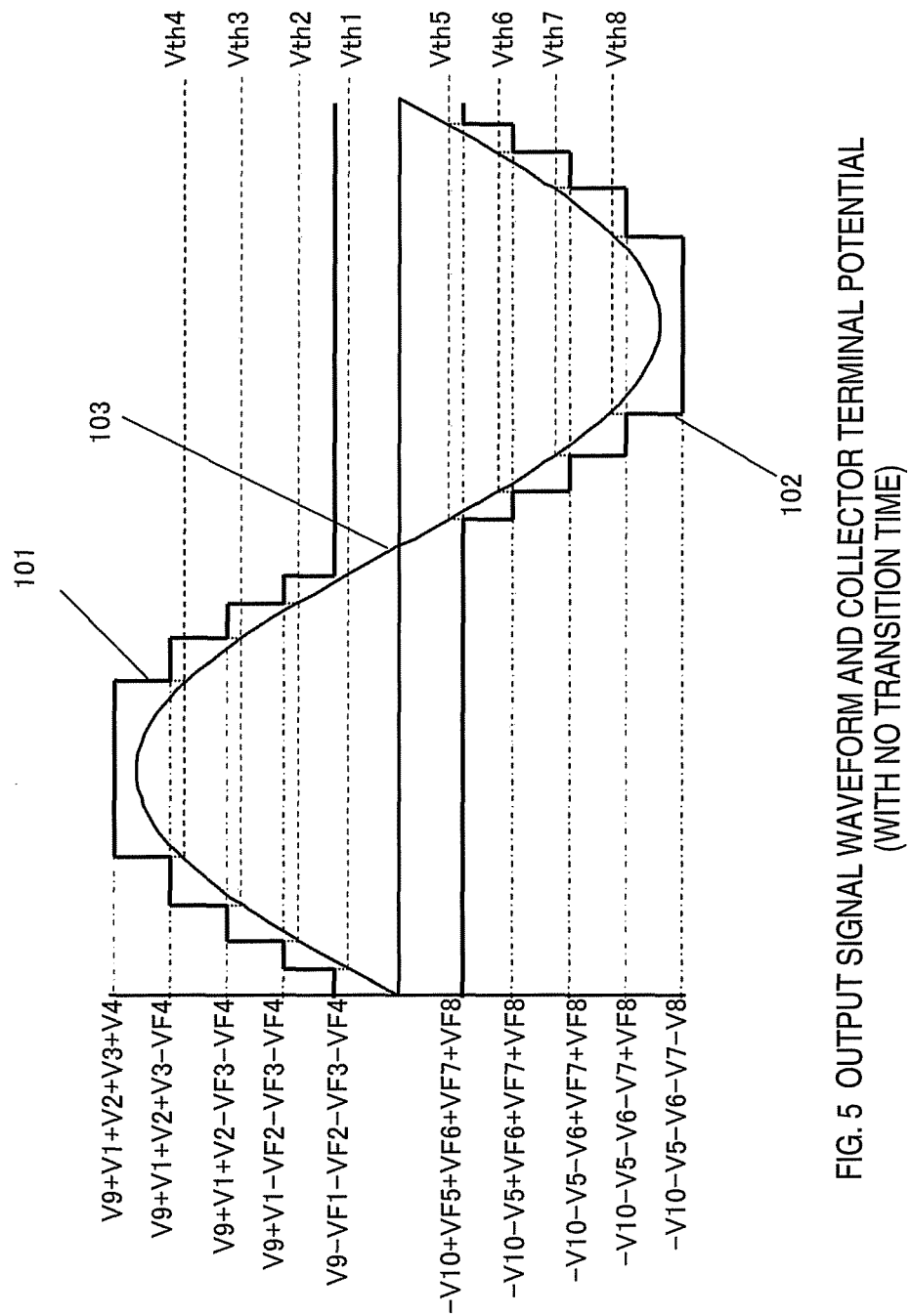
FIG. 5 OUTPUT SIGNAL WAVEFORM AND COLLECTOR TERMINAL POTENTIAL (WITH NO TRANSITION TIME)

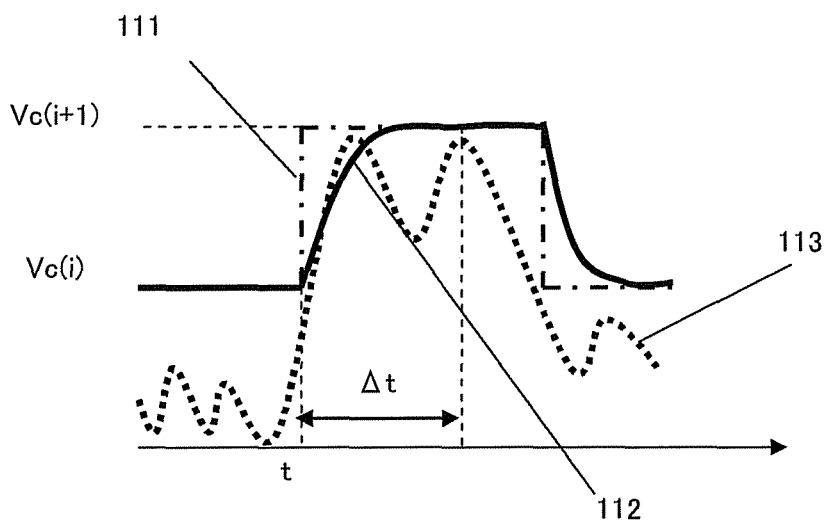
FIG. 6 EXAMPLE OF PUSH-PULL AMPLIFIER'S OUTPUT SIGNAL WAVEFORM AND VOLTAGE WAVEFORM APPLIED TO COLLECTOR TERMINAL

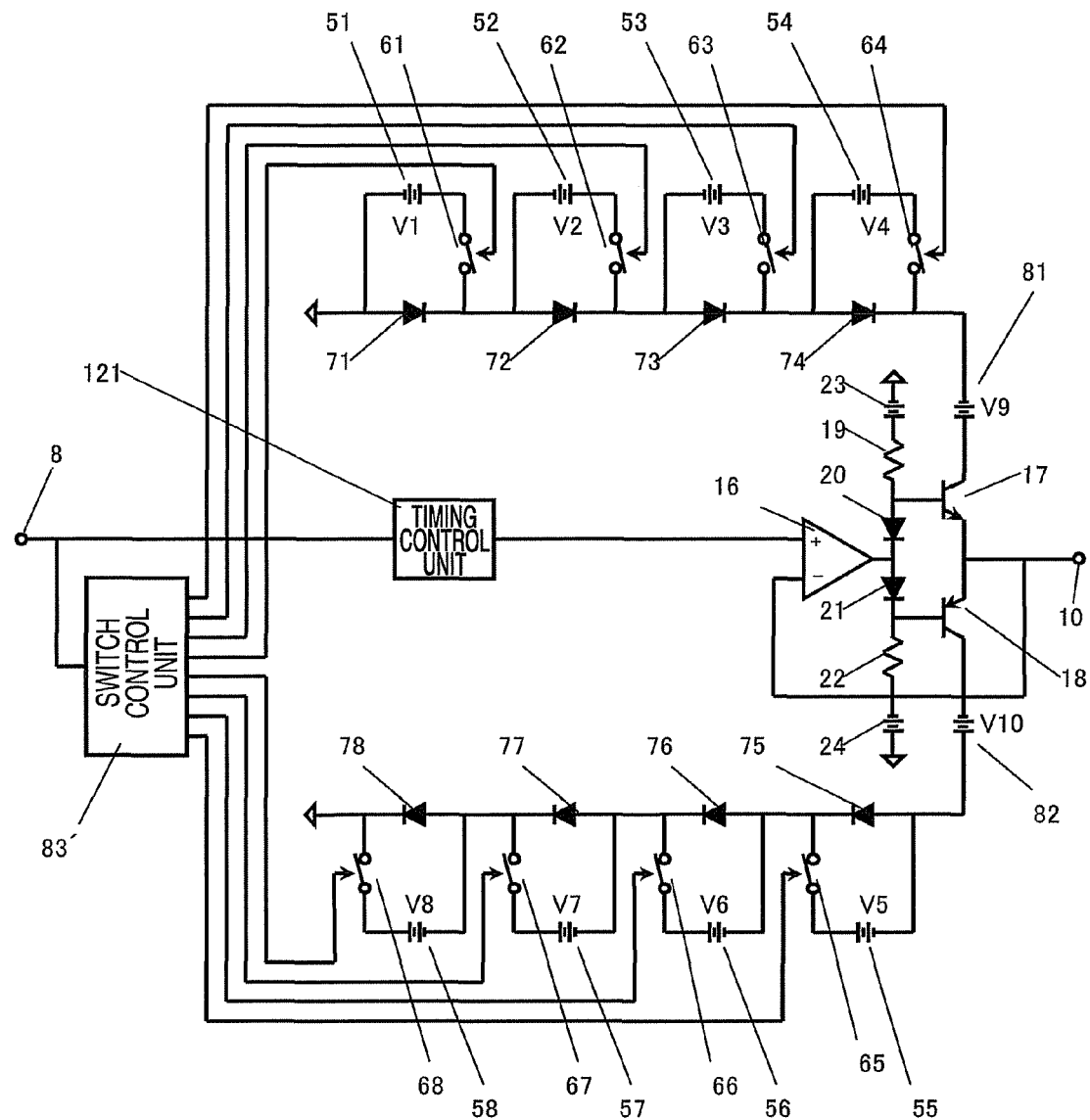
FIG. 7 PUSH-PULL AMPLIFIER USED IN POWER SUPPLY CIRCUIT OF 2ND EMBODIMENT

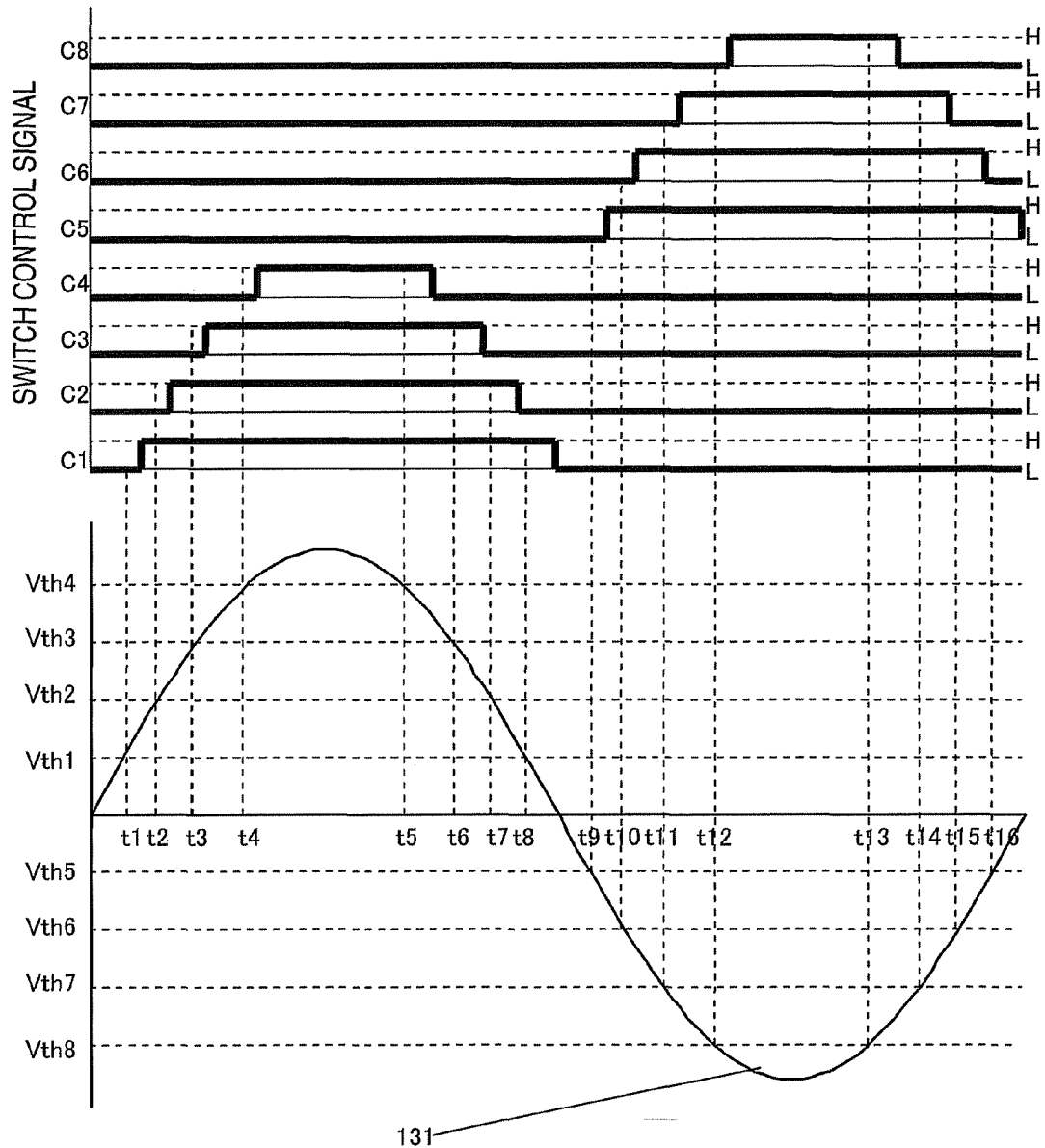
FIG. 8 EXAMPLE OF SIGNAL INPUTTED TO SWITCH CONTROL UNIT AND SWITCH CONTROL SIGNAL WAVEFORM

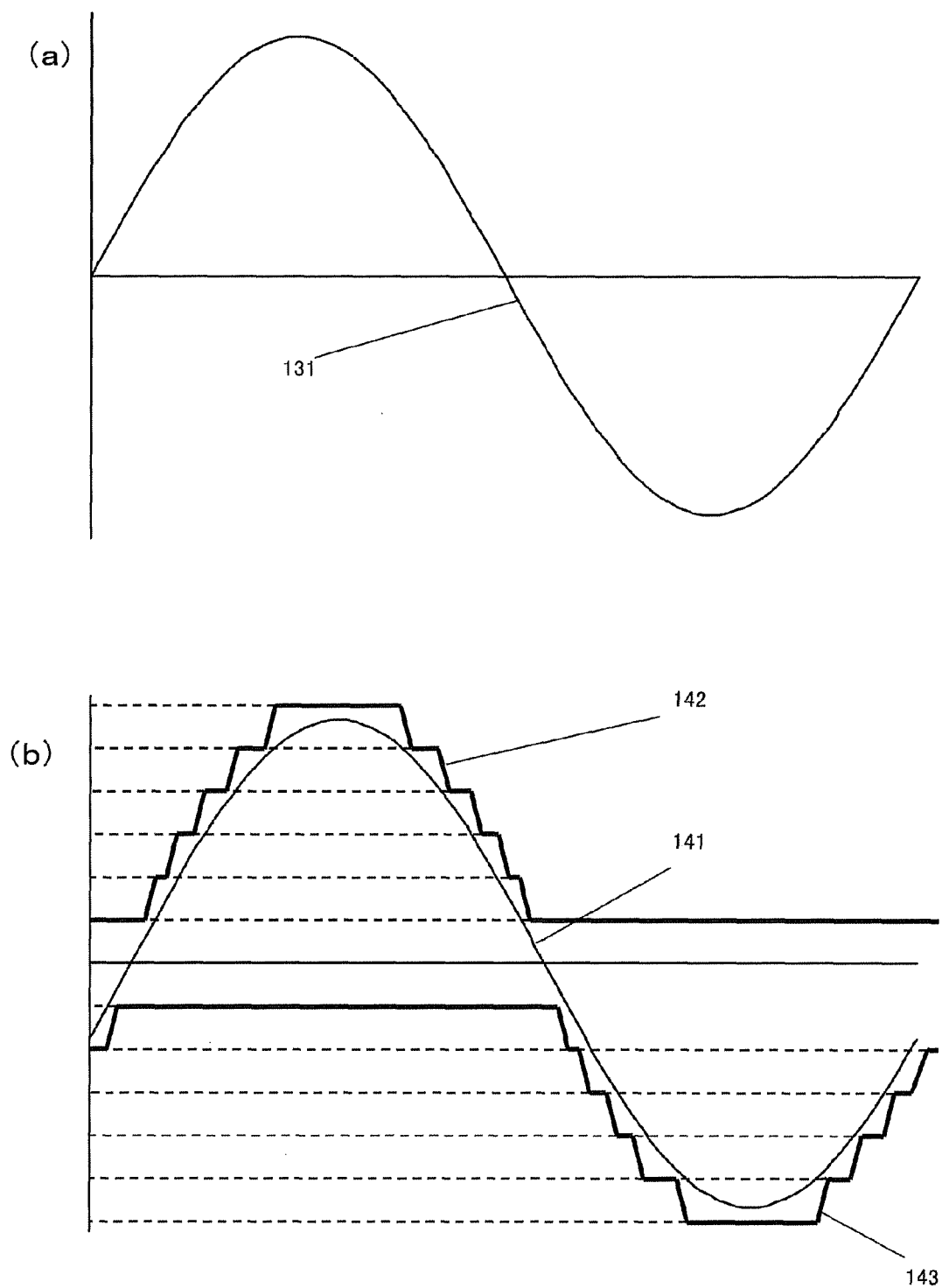
FIG. 9 PUSH-PULL AMPLIFIER'S INPUT/OUTPUT SIGNALS AND COLLECTOR VOLTAGE

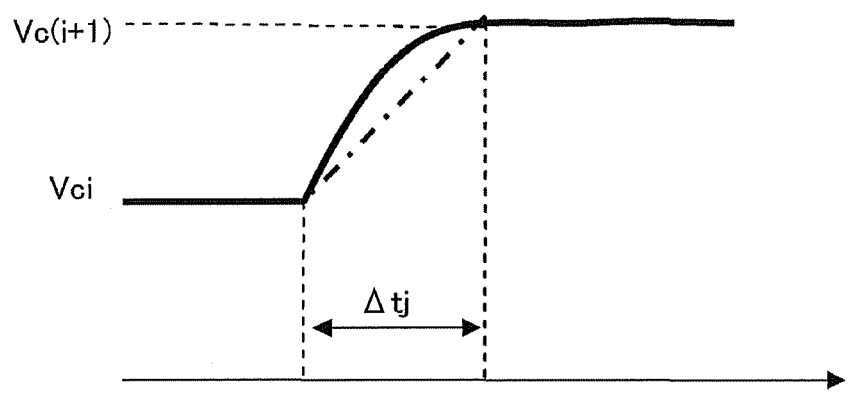
FIG. 10 LINEAR APPROXIMATION EXAMPLE OF A CHANGE IN COLLECTOR VOLTAGE

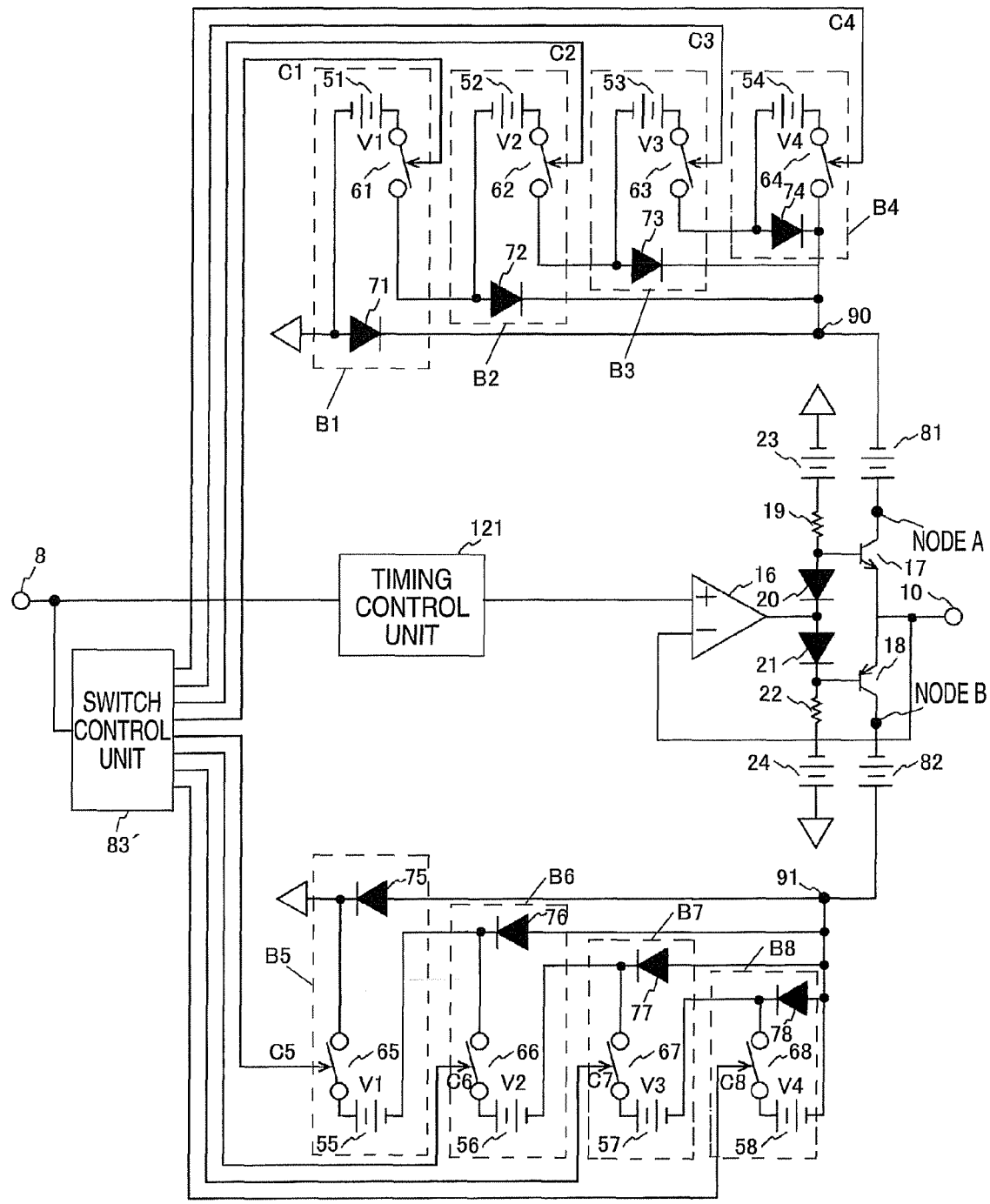
FIG. 11 ANOTHER PUSH-PULL AMPLIFIER EXAMPLE

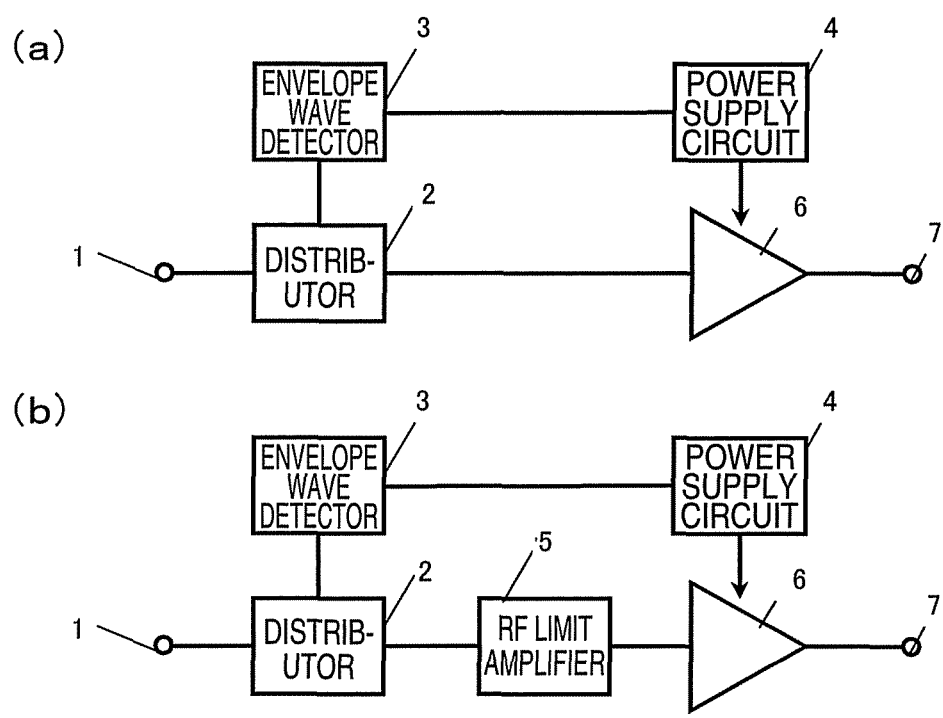
FIG. 12 ET AND EER POWER AMPLIFIERS

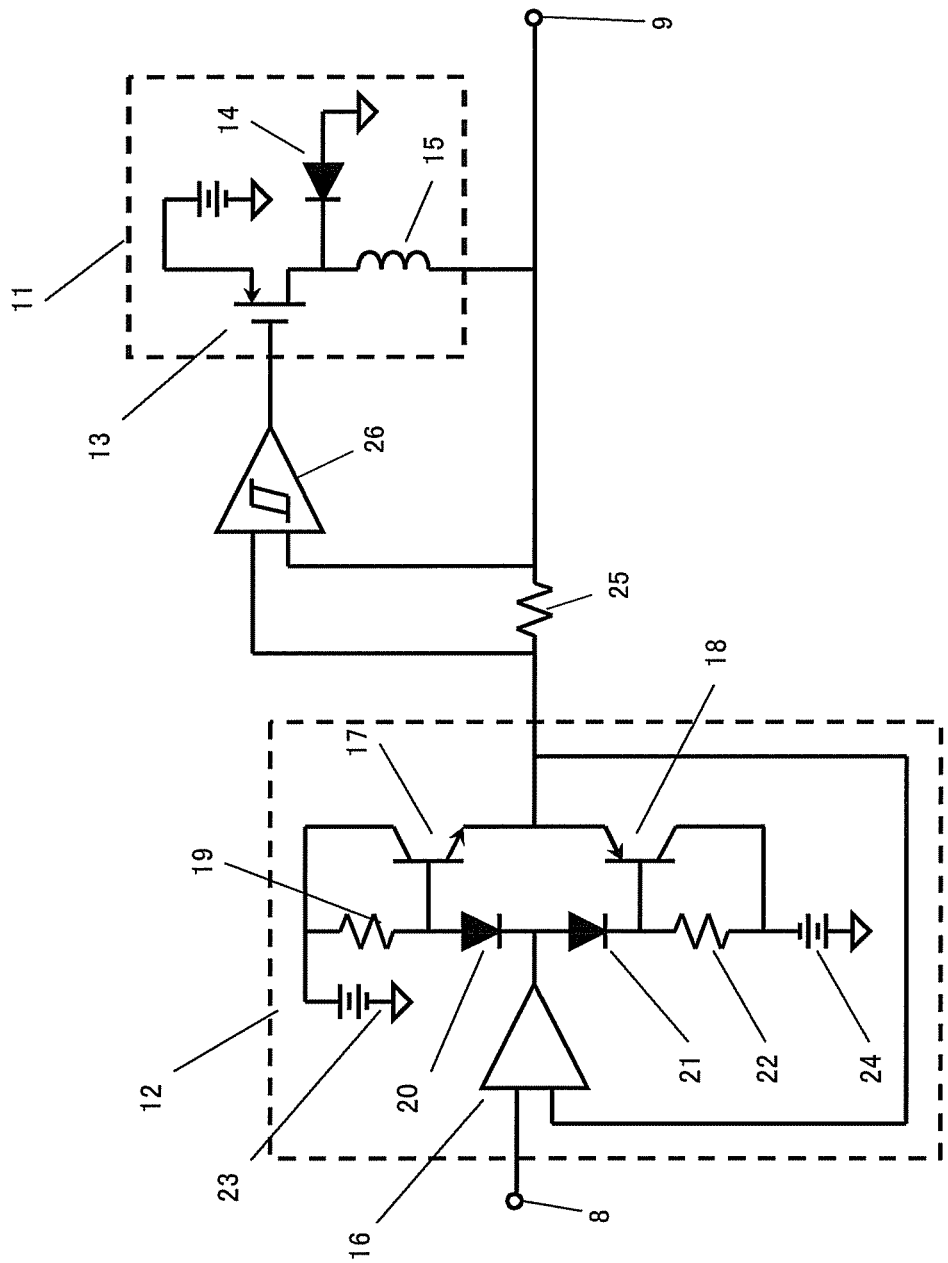
FIG. 13 CONVENTIONAL POWER SUPPLY CIRCUIT

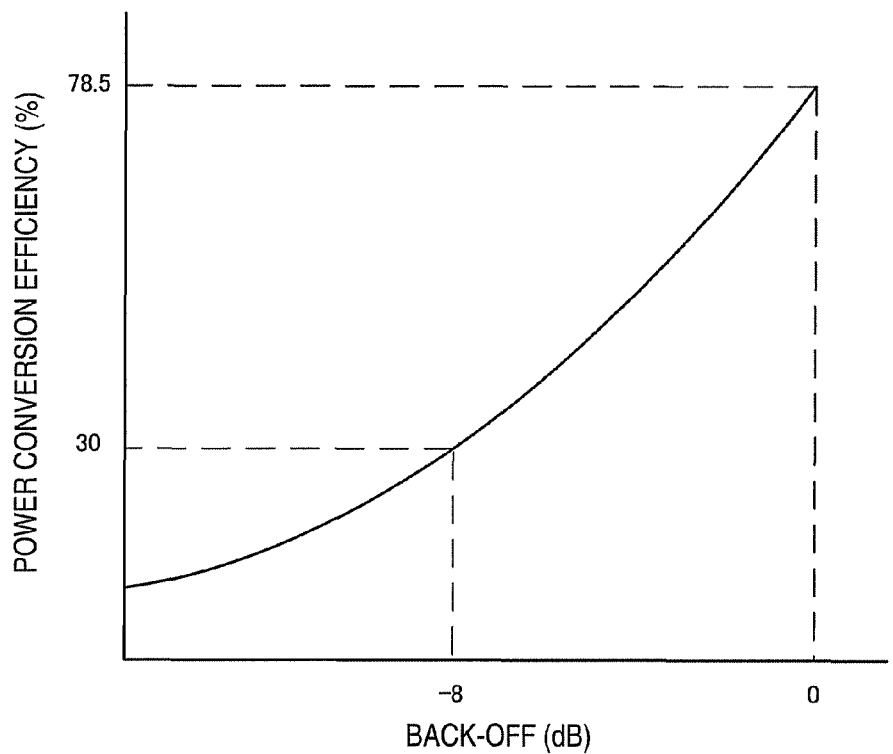
FIG. 14 POWER CONVERSION EFFICIENCY CHARACTERISTICS OF CONVENTIONAL PUSH-PULL AMPLIFIER
FIG.15
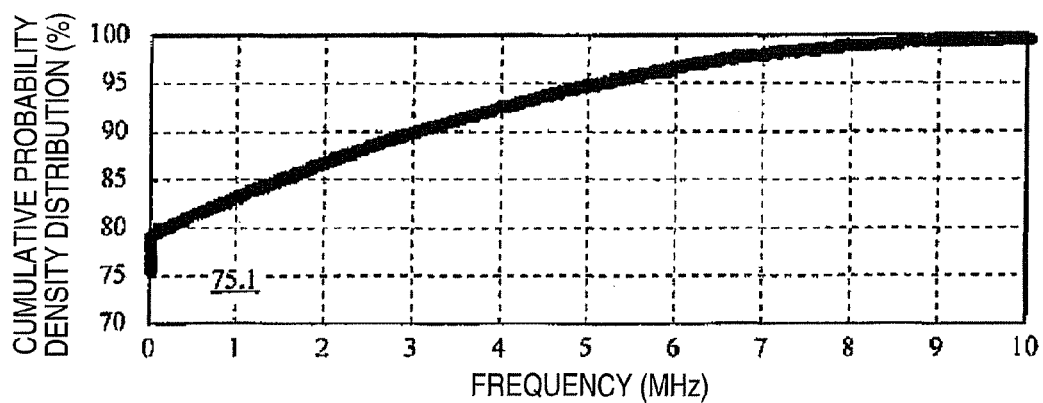
FIG. 15 ONE EXAMPLE OF CUMULATIVE PROBABILITY DENSITY DISTRIBUTION OF ENVELOPE SIGNAL SPECTRUM IN OFDM SIGNAL

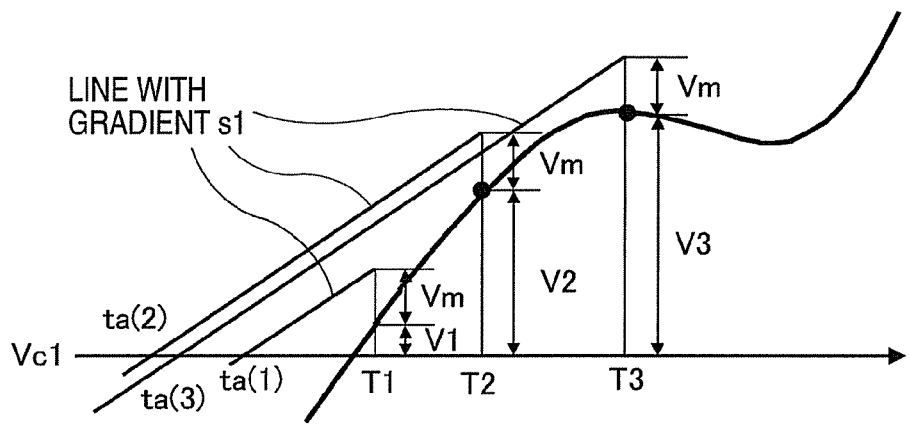
FIG. 16 RISE-UP TIMING OF SWITCH CONTROL SIGNAL
FIG.17
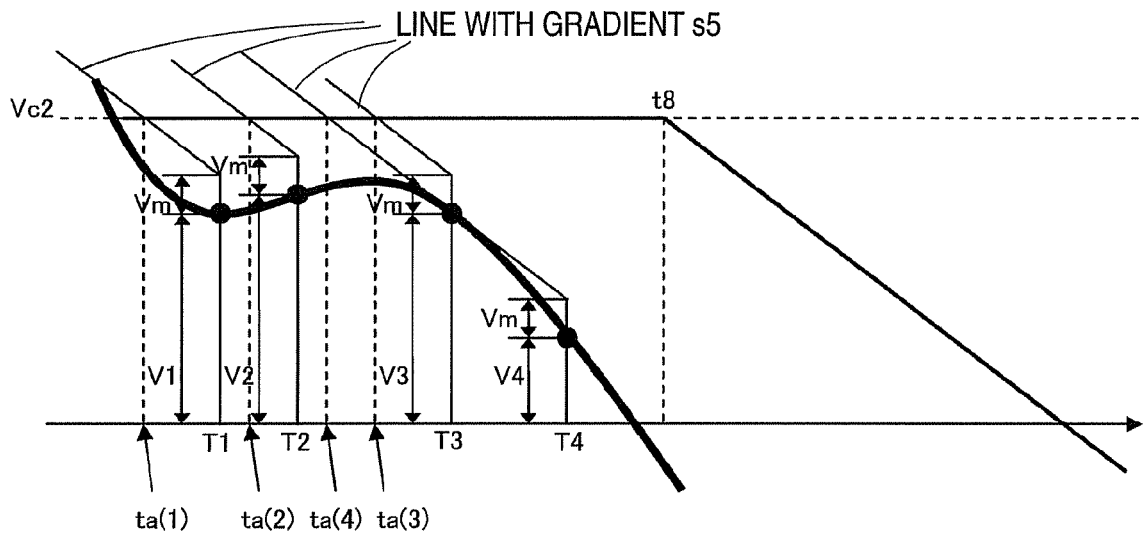
FIG. 17 FALL-DOWN TIMING OF SWITCH CONTROL SIGNAL

POWER SUPPLY CIRCUIT

CROSS-REFERENCE TO RELATED APPLICATIONS

This application is a 371 U.S. National Stage of International Application No. PCT/JP2012/079962, filed Nov. 19, 2012, which claims priority to Japanese Patent Application No. 2011-257502, filed Nov. 25, 2011. The disclosures of the above applications are incorporated herein by reference.

TECHNICAL FIELD

The present invention relates to power supply circuit for use in power amplifiers of transmitters that perform radio communication by means of broadband high-frequency signals, and more particularly to a power supply circuit capable of improving power conversion efficiency.

BACKGROUND ART

Explanation of Prior Art

As a demand for power amplifiers of transmitters, downsizing and weight-saving are strongly required due to restriction of installation locations for the sake of setup cost reduction. Although most of the volume/weight of equipment is occupied by a radiation fin module, which is for release of the heat to be generated by the loss of electrical power, it becomes possible by improvement of power efficiency to make the radiation fin smaller, which contributes to reduction in size and weight.

[Power Amplifier for Power Efficiency Improvement: FIG. 12]

Methodology for improving the power efficiency includes the ET (Envelope Tracking) scheme for controlling the power supply voltage to be applied to a power amplifier in compliance with the voltage amplitude of a signal inputted to the power amplifier, and EER (Envelope Elimination and Restoration) scheme for varying the supply voltage of a saturation-type power amplifier.

Power amplifiers employing the ET and EER schemes will be explained with reference to FIG. 12. FIG. 12(a) is a diagram schematically showing a configuration of an ET-type power amplifier, and (b) is a schematic configuration diagram of an EER power amplifier.

[ET Power Amplifier: FIG. 12(a)]

As shown in FIG. 12(a), the ET power amplifier includes an input terminal 1, divider 2, envelope wave detector 3, power supply circuit 4, main amplifier 6, and output terminal 7.

More specifically, the input terminal 1, divider 2, main amplifier 6 and output terminal 7 are connected in series. Connected to the divider 2 is envelope wave detector 3; connected to envelope wave detector 3 is power supply circuit 4. Power supply circuit 4 is connected to main amplifier 6, providing a configuration for supplying electric power.

In the ET scheme, an RF signal inputted from input terminal 1 is distributed by divider 2: one is inputted to envelope wave detector 3 for extracting an envelope curve and for inputting it to power supply circuit 4. Power supply circuit 4 varies the supply voltage being applied to main amplifier 6 by a voltage which is equal to or slightly larger than the envelope at the output of main amplifier 6.

Accordingly, a difference between the supply voltage applied to main amplifier 6 and the output signal amplitude is suppressed to a smaller level, thereby enabling main amplifier 6 to operate in a region which is less in power loss.

[EER Power Amplifier: FIG. 12(b)]

As shown in FIG. 12(b), the EER power amplifier has an input terminal 1, divider 2, envelope wave detector 3, power supply circuit 4, RF limit amplifier 5, main amplifier 6 and output terminal 7.

Briefly, this is different from the ET power amplifier in that RF limit amplifier 5 is provided between divider 2 and main amplifier 6 for limiting the input voltage applied to main amplifier 6.

In the EER power amplifier with the above-stated configuration, the RF signal inputted from input terminal 1 is distributed by divider 2: one is wave-detected by envelope wave detector 3, resulting in an envelope signal being inputted to power supply circuit 4. Then, power supply circuit 4 varies the supply voltage of main amplifier 6 according with the envelope signal.

The other RF signal distributed by divider 2 is subjected to removal of amplitude fluctuation components at RF limit amplifier 5 and then amplified by main amplifier 6 while retaining phase information only.

As the power supply voltage of main amplifier 6 varies according with the amplitude information from envelope wave detector 3, the amplitude information is restored, permitting main amplifier 6 to operate in its saturation state at all times; thus, a high efficiency is attained.

[Fast Operable Power Supply Circuit: FIG. 13]

Incidentally, when considering the efficiency of an entirety of the ET/EER power amplifier, not only the efficiency of main amplifier 6 but also the efficiency of power supply circuit 4 becomes important.

Envelope signals of broadband signals, such as a W-CDMA (Wideband-Code Division Multiple Access) signal and OFDM (Orthogonal Frequency Division Multiplexing) signal, are wide in band; so, the power supply circuit 4 is required to operate at high speeds.

Examples of such power supply circuit capable of fast operating are disclosed in Non Patent Literature 1 and Non Patent Literature 2 (see Non Patent Literature 1, 2).

Fast operable power supply circuits include the one that uses a push-pull amplifier as linear amplifier circuit and uses a class D circuit as DC/DC converter.

A configuration example of such power supply circuit will be explained using FIG. 13. FIG. 13 is a configuration diagram showing an example of fast-operable power supply circuit.

As shown in FIG. 13, the fast-operable power supply circuit (high-speed operation power supply circuit) is generally made up of an input terminal 8, a push-pull amplifier 12 which is a wideband voltage source, a combination of current detector 25 and hysteresis comparator 26 serving as control circuitry, a high-efficiency DC/DC converter 11, and an output terminal 9.

Note that the push-pull amplifier 12 corresponds to the push-pull amplifier unit defined in the appended claims.

And the input terminal 8 is connected to an output stage of envelope wave detector 3 shown in FIG. 12; output terminal 9 is connected to a power supply terminal of main amplifier 6 shown in FIG. 12.

The current detector 25 is constituted from a resistor, for example.

Note that the DC/DC converter 11 has a voltage source, switch element 13, diode 14 and inductance 15.

Regarding the push-pull amplifier 12, this will be described later.

[Operation of DC/DC Converter 11]

An operation of DC/DC converter 11 will be briefly explained.

In a case where an output of envelope wave detector 3 is DC component, DC/DC converter 11 operates in a tracking mode and causes switch element 13 to turn on and off periodically at a self-excitation frequency.

When the output of envelope wave detector 3 becomes DC component and AC component of high frequency, DC/DC converter 11 operates in a non-tracking mode, for causing switch element 13 to turn and off at a frequency basically equal to the AC high-frequency component. At this time, DC/DC converter 11 outputs the DC component only while causing high-frequency AC component to be outputted from push-pull amplifier 12.

[Efficiency of Power Supply Circuit]

In the high-speed operation power supply circuit shown in FIG. 13, it is conceivable to try to enhance the efficiency of power supply circuit by heightening the self-excitation frequency to thereby increase a trackable AC component, i.e., by increasing the ratio of energy outputted from high-efficiency DC/DC converter 11.

However, in broadband communication systems such as WiMAX (Worldwide Interoperability for Microwave Access) and LTE (Long Term Evolution) and the like, the envelope also becomes wider in band; thus, an increase in switching frequency of DC/DC converter 11 results in a likewise increase in switching loss, which leads to a decrease in efficiency of the power supply circuit.

In view of this, appropriate circuit constants are set up to arrange broadband communication systems, such as WiMAX, LTE and others, in such a way as to supply low-frequency AC components from high-efficiency DC/DC converter 11 while supplying high-frequency AC components from push-pull amplifier 12.

[Coping with Large Current of Power Supply Circuit]

By the way, in cases where output power of the main amplifier 6 is significant, it is necessary to supply a large amount of current from the power supply circuit 4 also.

In the high-speed operation power supply circuit of FIG. 13, those components capable of flowing required current may be selected for use as the switch element 13, diode 14 and inductance 15 in DC/DC converter 11.

However, regarding an operational amplifier used for push-pull amplifier 12, there are, in general, no components capable of letting such large current flow therein. Consequently, NPN and PNP transistors are connected to an output of operational amplifier, thereby increasing the capacity of outputtable current.

[Configuration of Push-Pull Amplifier: FIG. 13]

Next, a configuration of push-pull amplifier (prior known push-pull amplifier) for use in the traditional high-speed operation power supply circuit will be explained using FIG. 13.

As shown in FIG. 13, the traditional push-pull amplifier 12 is configured from an operational amplifier 16, a bias circuit made up of a resistor 19, diode 20, diode 21 and resistor 22, a push-pull circuit constituted from NPN transistor 17 and PNP transistor 18, DC voltage source 23, and DC voltage source 24.

And, in the push-pull amplifier 12 with this configuration, an input signal is inputted through input terminal 8 to the "+" terminal of operational amplifier 16; an output signal is fed back to the "−" terminal of this operational amplifier.

The diode 20 is for compensating a voltage drop between the base and emitter of NPN transistor 17; diode 21 is to compensate a voltage drop between the base and emitter of PNP transistor 18. These diodes constitute the bias circuit along with resistor 19 and resistor 22.

The NPN transistor 17 which is connected to DC voltage source 23 that is set at a voltage value higher than DC voltage source 24 and the PNP transistor 18 which is connected to DC voltage source 24 being set at a voltage value lower than DC voltage source 23 perform amplification by push-pull operations.

Then, NPN transistor 17 outputs a voltage higher than a reference voltage; PNP transistor 18 outputs a voltage lower than the reference voltage.

Output waveforms of NPN transistor 17 and PNP transistor 18 become half-rectified waveforms of a sine wave: this corresponds to a class B-biased amplifier. An output waveform of push-pull amplifier 12 becomes a composite of the output waveform of NPN transistor 17 and output waveform of PNP transistor 18.

[Power Conversion Efficiency of Class B Amplifier: FIG. 14]

Here, an explanation will be given of the power conversion efficiency of class B amplifier.

As is well known, the power conversion efficiency $\eta$ when the class B amplifier outputs a sine wave is represented by Equation 1.

$$\eta = \pi/4 \times Vomax/Vdd. \quad \text{(Eq. 1)}$$

Explaining Equation 1 for NPN transistor 17, Vdd is the power supply voltage of DC voltage source 23, and Vomax is the maximum value of an output voltage of NPN transistor 17.

In Equation 1, the power conversion efficiency $\eta$ is 78.5% in the case of Vomax being the same voltage as Vdd—i.e., in the event of a saturation output. When the maximum output voltage Vomax decreases, the power conversion efficiency $\eta$ also decreases.

FIG. 14 is an explanatory diagram showing power conversion efficiency characteristics of class B amplifier.

In FIG. 14, there is shown the power conversion efficiency $\eta$ for the output voltage, wherein the back-off of the lateral axis is the one that represents Vomax/Vdd logarithmically.

A point at which the back-off is 0 dB indicates the saturation output. The power conversion efficiency $\eta$ at this time is 78.5% as stated previously. When the back-off becomes larger (when the maximum output voltage Vomax decreases), the power conversion efficiency $\eta$ decreases. When the back-off is −8 dB, the power conversion efficiency $\eta$ becomes 30%.

[Power Conversion Efficiency of Push-Pull Amplifier: FIG. 14]

Although in Equation 1 and FIG. 14 an explanation was given as to the NPN transistor 17, the same goes for PNP transistor 18 also; thus, the characteristics of an entirety of push-pull amplifier 12 is also representable by Equation 1 and FIG. 14.

Note here that although in the push-pull amplifier 12 the operational amplifier 16 and bias circuit also consume power, the power conversion efficiency of push-pull amplifier 12 is almost identical to the characteristics shown in FIG. 14 because the current amplification factors hfe of NPN transistor 17 and PNP transistor 18 are large and the power consumption of operational amplifier 16 is little compared to that of push-pull amplifier 12.

[Cumulative Probability Density Distribution Example of Spectrum of Envelope Signal in OFDM Signal: FIG. 15]

An explanation will here be given, using FIG. 15, of the cumulative probability density distribution of an envelope signal in OFDM signal. FIG. 15 is an explanatory diagram showing an example of the cumulative probability density distribution of envelope signal in OFDM signal.

In FIG. 15, an envelope curve of OFDM modulation signal with a band width of 10 MHz and PAPR (Peak to Average Power Ratio) of 8 dB was obtained; then, the cumulative probability density distribution of electric power was plotted from DC up to 10 MHz.

As stated above, although the power supply circuit 4 supplies DC and low-frequency components from DC/DC converter 11 and supplies high-frequency components from push-pull amplifier 12, if it is assumed that frequency components of less than 3 MHz are supplied from DC/DC converter 11 while letting push-pull amplifier 12 supply components of 3 MHz or above, it can be seen from FIG. 15 that 90% of the power to be supplied by power supply circuit 4 is supplied from DC/DC converter and 10% of the power is fed from push-pull amplifier 12.

[Power Supply Circuit's Power Conversion Efficiency for OFDM Signal: FIG. 14]

An explanation will be given of the power conversion efficiency of power supply circuit 4 in the case of an OFDM signal.

The power conversion efficiency of DC/DC converter 11 that supplies DC and low-frequency components is determined by several factors including the ON resistance of switch element 13, switching loss, diode's forward voltage and the loss of inductance 14. Let it be $\eta d$.

Meanwhile, the PAPR of OFDM signal is 8 dB; thus, as can be seen from FIG. 10, the power conversion efficiency of push-pull amplifier 12 becomes the power conversion efficiency at the time of the back-off being −8 dB. Here, the power conversion efficiency at this time is given as $\eta b$.

Specifically, 10% of the power to be supplied by power supply circuit 4 to main amplifier 6 is supplied from push-pull amplifier 12 with the power conversion efficiency $\eta b$, and 90% is supplied from DC/DC converter 11 with the power conversion efficiency $\eta d$. Hence, the power conversion efficiency $\eta s$ of power supply circuit 4 is calculable by Equation 2.

$$\eta s = 1/(10\%/\eta b + 90\%/\eta d). \quad \text{(Eq. 2)}$$

Assuming $\eta b=30\%$ and $\eta d=90\%$, $\eta s$ is 75%.

To improve the power conversion efficiency of the entirety of power supply circuit 4, it is necessary to increase the efficiency of push-pull amplifier 12 which is low in power conversion efficiency.

In the traditional push-pull amplifier 12, the voltages of the DC voltage source 23 and DC voltage source 24 which are connected to the collector terminals of NPN transistor 17 and PNP transistor 18 respectively are constant regardless of an output level; accordingly, as the output level decreases, the power conversion efficiency also decreases.

CITATION LIST

Non Patent Literature

NON PATENT LITERATURE 1: "An Improved Power-Added Efficiency 19-dBm Hybrid Envelope Elimination and Restoration Power Amplifier for 802.11g WLAN Applications," Feipeng Wang et al., IEEE Transactions on Microwave Theory and Techniques, Vol. 54, No. 12, December 2006, pp. 4086-4099.

NON PATENT LITERATURE 2: "A Class B Switch-Mode Assisted Linear Amplifier," Geoffrey R. Walker, IEEE Transactions on Power Electronics, Vol. 18, No. 6, November 2003, pp. 1278-1285.

SUMMARY OF INVENTION

Technical Problem

However, the traditional push-pull amplifier is faced with a problem which follows: the power conversion efficiency decreases with a decrease in output level because the voltages of DC voltage sources connected to the collector terminals of NPN and PNP transistors stay at a constant level regardless of the output level.

Note here that Non Patent Literatures 1 and 2 are silent about any techniques for adjusting the voltages of DC voltage sources connected to the collector terminals of NPN and PNP transistors in compliance with the output level.

The present invention has been made in view of the actual situation, and its object is to provide a power supply circuit which adjusts the voltages of DC voltage sources connected to the collector terminals of NPN and PNP transistors of a push-pull amplifier in compliance with an output level to thereby ensure that the power conversion efficiency does not decrease even when the output level goes low.

Solution to Problem

To solve the problem of the prior art stated above, the present invention provides a power supply circuit used for power amplification, which includes a push-pull amplifier unit for amplifying an input signal by push-pull amplification schemes, a variable power supply unit responsive to a control signal for varying the voltage level of a power supply voltage to be provided to the push-pull amplifier unit, a timing adjustment unit for delaying the input signal inputted to the push-pull amplifier unit, and a control unit which outputs a control signal for controlling the voltage level of the power supply voltage based on the input signal, characterized in that the control unit operates, in the case of potential rise-up of the control signal, to raise the control signal at an early timing adapted for a transition time of voltage level changeover with respect to a delay time at the timing adjustment unit and, in the case of fall-down of the control signal, causes the control signal to fall down at a timing of the delay time.

Another feature of the present invention is that in the above-stated power supply circuit, the control unit stores, as a timing delay time, a time length obtained by subtracting the transition time from the delay time of the timing adjustment unit in a way corresponding to the rise-and-fall voltage level changeover of the control signal and, in the case of rise-up of the control signal, raises the control signal at a timing which is delayed from the input signal timing by said timing delay time.

A further feature of the present invention is that in the power supply circuit, the control unit stores a gradient of transition of voltage level corresponding to the rise-up changeover of the control signal and calculates, in the case of rise-up of the control signal, a timing for raising the control signal based on a detected input signal and the gradient, thereby causing the control signal to potentially rise at this timing calculated.

Another further feature of the present invention is that in the power supply circuit, the control unit stores a gradient of transition of voltage level corresponding to the fall-down changeover of the control signal and calculates, in the case of fall-down of the control signal, a fall-down timing of the control signal based on a detected input signal and the gradient in substitution for the processing for causing the control signal to fall at the timing of the delay time, thereby forcing the control signal to fall at the timing calculated.

The present invention also provides a power amplifier of the type employing the ET scheme, which includes an envelope wave detector for performing wave detection of an input signal, the above-stated power supply circuit with a class D circuit being provided at an output stage of the push-pull amplifier unit, and a main amplifier for amplifying a signal inputted thereto, characterized in that the power supply circuit supplies to said main amplifier with a power supply voltage adapted for an envelope curve detected by the envelope wave detector.

The present invention also provides a power amplifier of the type using the EER scheme, which includes an envelope wave detector for performing wave detection of an input signal, the above-stated power supply circuit with a class D circuit provided at the output stage of the push-pull amplifier unit, a main amplifier for amplifying an inputted signal, and a limit amplifier which limits the voltage of an input signal and outputs it to the main amplifier, characterized in that the power supply circuit supplies the main amplifier with a power supply voltage adapted for an envelope curve detected by the envelope wave detector.

Advantageous Effects of Invention

According to the present invention, the power supply circuit used for power amplification is arranged to include a push-pull amplifier unit which amplifies an input signal by push-pull amplification schemes, a variable power supply unit responsive to a control signal for varying the voltage level of a power supply voltage that is provided to the push-pull amplifier unit, a timing adjustment unit which delays the input signal inputted to the push-pull amplifier unit, and a control unit which outputs a control signal for controlling the voltage level of the power supply voltage based on the input signal, wherein the control unit operates, in the case of potential rise-up of the control signal, to raise the control signal at an early timing adapted for a transition time of voltage level changeover with respect to a delay time at the timing adjustment unit and, in the case of fall-down of the control signal, causes the control signal to fall down at a timing of the delay time; therefore, there are effects of reducing the influence of the transition time required for rise-up of voltage level without having to lower the power conversion efficiency even when the output level decreases, making it possible to supply the power supply voltage keeping pace with or "tracking" the rise-up waveform of an output signal, improving the efficiency while simultaneously preventing saturation at the amplifier unit, and enabling improvement of distortion characteristics of the output signal.

Additionally, according to the present invention, the power supply circuit is arranged so that the control unit stores, as the timing delay time, a time length obtained by subtracting the transition time from the delay time of the timing adjustment unit in a way corresponding to the rise-and-fall voltage level changeover of the control signal and, in the case of rise-up of the control signal, raises the control signal at a timing which is delayed from the input signal timing by said timing delay time; thus, there is an effect of making it possible to readily perform the processing for raising the control signal at a timing earlier than the output signal by a time length equivalent to the transition time.

Additionally, according to the present invention, the power supply circuit is arranged so that the control unit stores the gradient of a transition of voltage level corresponding to the rise-up changeover of the control signal and calculates, in the case of rise-up of the control signal, a timing for raising the control signal based on a detected input signal and the gradient, thereby causing the control signal to potentially rise at this timing calculated; thus, there are effects of raising the control signal at an appropriate timing based on the actual signal waveform, permitting the supply voltage to track a steep rise-containing wideband signal also, and making it possible to improve the distortion characteristics of the output signal.

Additionally, according to the present invention, the power supply circuit is arranged so that the control unit stores the gradient of a transition of voltage level corresponding to the fall-down changeover of the control signal and calculates, in the case of fall-down of the control signal, a fall-down timing of the control signal based on a detected input signal and the gradient in substitution for the processing for causing the control signal to fall at the timing of the delay time, thereby forcing the control signal to fall at the calculated timing; thus, there are effects of letting the control signal fall at an appropriate timing based on the real signal waveform, permitting the supply voltage to track a steep fall-containing wideband signal also, and making it possible to improve the distortion characteristics of the output signal.

Additionally, according to the present invention, the ET power amplifier is arranged to include an envelope wave detector for performing wave detection of an input signal, the above-stated power supply circuit with a class D circuit being provided at an output stage of the push-pull amplifier unit, and a main amplifier for amplifying a signal inputted thereto, wherein the power supply circuit supplies to said main amplifier with a power supply voltage adapted for an envelope curve detected by the envelope wave detector; thus, there are effects of making it possible to supply the supply voltage that successfully tracks the rise-up/fall-down waveforms of the output signal, improving the efficiency of an entirety of the power amplifier, and simultaneously enabling improvement of the distortion characteristics of output signal.

Additionally, according to the present invention, the power amplifier of EER scheme is arranged to include an envelope wave detector for performing wave detection of an input signal, the above-stated power supply circuit with a class D circuit provided at the output stage of the push-pull amplifier unit, a main amplifier for amplifying an inputted signal, and a limit amplifier which limits the voltage of an input signal and outputs it to the main amplifier, wherein the power supply circuit supplies the main amplifier with a power supply voltage adapted for an envelope curve detected by the envelope wave detector; thus, there are effects of making it possible to supply the supply voltage that successfully tracks or trails the rising/falling waveforms of the output signal, improving the efficiency of an entirety of the power amplifier, and simultaneously enabling improvement of the distortion characteristics of output signal.

BRIEF DESCRIPTION OF DRAWINGS

FIG. 1 This is a configuration diagram of a push-pull amplifier for use in a power supply circuit in accordance with first embodiment of the present invention.

FIG. 2 An explanatory diagram showing one example of switch control signals in the first push-pull amplifier and a transistor collector voltage associated therewith along with an output waveform thereof.

FIG. 3 An explanatory diagram showing power conversion efficiency characteristics of the first push-pull amplifier.

FIG. 4 A block diagram showing a configuration example of DC voltage source circuit which supplies DC voltage to the collector terminal of an NPN transistor 17.

FIG. 5 An explanatory diagram showing a relationship of an output signal waveform and collector terminal voltage in the absence of a transition time.

FIG. 6 An explanatory diagram showing a transition time of the collector voltage of NPN transistor 17.

FIG. 7 A configuration diagram of a push-pull amplifier for use in a power supply circuit in accordance with second embodiment of the present invention.

FIG. 8 An explanatory diagram showing control timings of switch control signals in the second push-pull amplifier.

FIG. 9 An explanatory diagram showing a relation of input/output signals of the second push-pull amplifier and a collector voltage.

FIG. 10 An explanatory diagram in the case of performing linear approximation of a gradient in the saturation state of collector voltage.

FIG. 11 An explanatory diagram showing a configuration of another push-pull amplifier used in the second power supply circuit.

FIG. 12 (a) is a schematic configuration diagram showing an ET power amplifier, and (b) is a schematic configuration diagram showing an EER power amplifier.

FIG. 13 A configuration diagram showing an example of power supply circuit which operates at high speeds.

FIG. 14 An explanatory diagram showing power conversion efficiency characteristics of a class B amplifier.

FIG. 15 An explanatory diagram showing an example of cumulative probability density distribution of an envelope signal in OFDM signal.

FIG. 16 An explanatory diagram showing a method for calculating the rise-up timing of a switch control signal C1.

FIG. 17 An explanatory diagram showing a method for calculating the fall-down timing of switch control signal C1.

DESCRIPTION OF EMBODIMENTS

Embodiments of the present invention will be described with reference to the accompanying drawings below.

Embodiment Summary

A power supply circuit in accordance with an embodiment of the present invention is arranged in a manner that a push-pull amplifier includes first and second power supply voltage generation circuits each having a serial connection of a plurality of circuit blocks, each of which has a serial connection of a switch and a DC supply voltage source and further has a diode being connected in parallel with this serial connection; wherein the first and second power supply voltage generation circuits are connected to collector terminals of NPN and PNP transistors respectively; and wherein a switch control unit is operatively responsive to an input signal level for outputting a control signal which controls turn-on/off of switches serving to connect DC voltage sources of the plurality of blocks to the collector terminal of NPN transistor or PNP transistor and for controlling collector voltages of NPN and PNP transistors in compliance with the input signal level to thereby make it possible to permit the collector voltage to track an output level and also enable achievement of an operation proximate to the saturation even in cases where the output level is low, whereby it is possible to improve the power conversion efficiency of an entirety of the power supply circuit.

In addition, a power supply circuit in accordance with one embodiment of the present invention is such that a timing adjustment unit is further provided in the above-stated power supply circuit, wherein the timing adjustment unit delays the input signal by a predetermined length of time and wherein the switch control unit performs potential rise-up of the control signal at a timing earlier than the delay time by a time equivalent to the transition time of level changeover adapted for the voltage level of the collector voltage in the event of changeover of the control signal that controls turn-on/off of each switch; thus, it is possible to reduce the influence of the transition time required for level changeover of collector voltage, thereby enabling improvement of the distortion of output waveform of the power supply circuit.

In addition, a power supply circuit in accordance with an embodiment of the present invention is such that the switch control unit in the above-stated power supply circuit is arranged to calculate a rise-up or fall-down timing of the control signal based on both the prestored gradient of level changeover adapted for the collector voltage level and a detected input signal level and then cause the control signal to rise or fall at such timing; thus, it is possible to determine the output timing of control signal based on the actual signal waveform, thereby enabling improvement of the distortion of output waveform of the power supply circuit.

First Embodiment

FIG. 1

A power supply circuit in accordance with first embodiment of the present invention includes a push-pull amplifier and a DC/DC converter as in the traditional power supply circuit shown in FIG. 13.

The power supply circuit in accordance with the first embodiment of this invention will be explained using FIG. 1. FIG. 1 is a configuration diagram of the push-pull amplifier used in the power supply circuit in accordance with the first embodiment of this invention.

As shown in FIG. 1, the push-pull amplifier (first push-pull amplifier) used in the power supply circuit (first power supply circuit) in accordance with the first embodiment of this invention includes, as similar components to those of the traditional push-pull amplifier shown in FIG. 13, an input terminal 8, an output terminal 10, an operational amplifier 16, a bias circuit made up of resistor 19, diodes 20-21 and resistor 22, a push-pull circuit constituted from NPN transistor 17 and PNP transistor 18, and DC voltage sources 23-24. A similar component to the traditional push-pull amplifier corresponds to the push-pull amplifier unit as claimed.

And, as a characterizing portion of the first push-pull amplifier, it has a switch control unit 83, a serial combination of DC voltage source 81 and plural circuit blocks B1 to B4 which is connected to the collector of NPN transistor 17, and a serial connection of DC voltage source 82 and plural circuit blocks B5 to B8 which is coupled to the collector of PNP transistor 18.

Voltages of the DC voltage sources 81-82 are given by V9 and V10, respectively.

The DC voltage source 81 and plural circuit blocks B1-B4 along with the DC voltage source 82 and plural circuit blocks B5-B8 correspond to the variable power supply unit as claimed.

[Circuit Blocks B1-B4]

Configurations of the circuit blocks B1-B4 on NPN transistor 17's side will now be explained.

The circuit blocks B1-B4 have DC voltage sources (51-54), switches (61-64) and diodes (71-74), respectively. In each block, the "−" side (negative side) of DC voltage source is connected to the anode of its associated diode, and the "+" side (positive side) of DC voltage source is coupled to the cathode through its associated switch.

Furthermore, the anode of diode 71 of circuit block B1 is connected to ground, and its cathode is coupled to the anode of diode 72 of circuit block B2. In a similar way, the following diodes 73-74 of circuit blocks B3-B4 are series-connected, letting the cathode of circuit block B4 be connected to the "−" side (negative side) of DC voltage source 81.

The circuitry configured from the series-connected circuit blocks B1-B4 is called the first power supply voltage generation circuit.

And the switches 61-64 are on/off-controlled by switch control signals C1-C4 from a switch control unit 83 to be later described. The voltage of DC voltage source of a circuit block with its switch turned on and the voltage of DC voltage source 81 are added together, whereby a voltage which is positive relative to a reference voltage is applied to the collector terminal of NPN transistor 17.

In short, the switch-selected DC voltage source and DC voltage source 81 become series-connected.

Note here that voltages of DC voltage sources 51, 52, 53 and 54 of circuit blocks B1-B4 are given by V1, V2, V3 and V4.

[Circuit Blocks B5-B8]

Similarly, the circuit blocks B5-B8 on PNP transistor 18's side have DC voltage sources (55-58), switches (65-68) and diodes (75-78), respectively. In each block, the "−" side of DC voltage source is connected to the anode of diode, and the "+" side of DC voltage source is connected via switch to the cathode thereof.

The cathode of diode 78 of circuit block B8 is coupled to ground; its anode is connected to the cathode of diode 77 of circuit block B7. In this way, the following diodes 76, 75 of circuit blocks B6, B5 are series-connected, letting the anode of circuit block B5 be connected to the "+" side of DC voltage source 82.

Circuitry configured from the series-connected circuit blocks B5-B8 is called the second power supply voltage generation circuit.

The first power supply voltage generation circuit and second power supply voltage generation circuit correspond to the variable power supply unit as claimed.

And the switches 65-68 are on/off-controlled by switch control signals C5-C8 from the switch control unit 83 to be described later. The voltage of DC voltage source of a circuit block with its switch turned on and the voltage of DC voltage source 82 are added together whereby a negative voltage relative to the reference voltage is applied to the collector terminal of PNP transistor 18.

In short, the switch-selected DC voltage source and DC voltage source 82 are series-connected.

Note that voltages of DC voltage sources 55, 56, 57 and 58 of circuit blocks B5-B8 are given as V5, V6, V7 and V8, respectively.

The switch control signals C1-C4 and C5-C8 correspond to the control signals recited in claims.

[Switch Control Unit 83]

An explanation will next be given of the switch control unit 83—this is a characterizing part of the first push-pull amplifier.

The switch control unit 83 outputs, based on a signal (envelope signal) inputted from input terminal 8, switch control signals C1, C2, C3, C4 for respectively controlling turn-on/off of switches 61, 62, 63, 64 of circuit blocks B1, . . . , B4 in such a way that the voltage applied to the collector terminal of NPN transistor 17 is set to an appropriate value.

Similarly, the switch control unit 83 outputs, based on the envelope signal, switch control signals C5, C6, C7, C8 for respectively controlling turn-on/off of switches 65, 66, 67, 68 of circuit blocks B5, . . . , B8 to ensure that the voltage applied to the collector terminal of PNP transistor 18 is set at an appropriate value.

More specifically, the switch control unit 83 has a control signal generation circuit which outputs eight kinds of switch control signals after having set a respective one of them to either a high level (H level, ON) or low level (L level, OFF), which circuit outputs each switch control signal having H level or L level based on the inputted envelope signal.

Each control signal generation circuit of switch control unit 83 is constituted from a comparator circuit, for example.

With this arrangement, it is possible in the first push-pull amplifier to apply a collector voltage tracking the output voltage to the NPN transistor 17 and PNP transistor 18 in responding to a change in power level of input signal, thereby improving the power conversion efficiency of the push-pull amplifier, thus making it possible to improve the efficiency of an entirety of the power supply circuit.

[Operation of First Push-Pull Amplifier: FIG. 1]

Firstly, operations of the circuit blocks B1-B4 and B5-B8 will be briefly explained.

In each of circuit blocks B1-B4 and B5-B8, the diode's anode terminal is connected to the negative side of DC voltage source whereas the cathode node is connected to the positive side of DC voltage source. By serially connecting such circuit blocks B1-B4, B5-B8 and controlling turn-on/off of each switch, it becomes possible to apply an added voltage to the collector terminal of NPN transistor 17, PNP transistor 18.

In the case of the switch being turned on, the voltage of DC voltage source of the circuit block is added, causing a current to flow in DC voltage source; so, the circuit operates. At this time, no current flows in the diode since there exists the reverse voltage of forward direction.

Alternatively, in the case of the switch being turned off, the DC voltage source of the circuit block becomes open-circuited; so, voltage addition is not done, but current flows in the diode, resulting in the circuit being rendered operative.

And, in the first push-pull amplifier, the switch control unit 83 outputs, in compliance with the envelope signal inputted from input terminal 8, switch control signals C1-C8 after having changed the level of each signal to either H level or L level, thereby controlling turn-on/off of switches of corresponding circuit blocks.

With this, a collector voltage which is positive relative to the reference voltage is applied to NPN transistor 17, and a collector voltage that is negative relative to the reference voltage is applied to PNP transistor 18 in compliance with the input power level.

[Switch Control Signal and Transistor's Collector Voltage: FIG. 2]

An explanation will next be given, using FIG. 2, of a relationship of switch control signal in the first push-pull amplifier and transistor's collector voltage. FIG. 2 is an explanatory diagram showing one example of switch control signals in the first push-pull amplifier along with resultant collector voltage and output waveform of transistor.

At (a) of FIG. 2, there is shown an exemplary set of switch control signals C1-C8, for indicating whether each of switch control signals C1-C8 is in the state that causes its corresponding switch to turn on (H level) or in the state that causes the switch to turn off (L level).

In the example of FIG. 2(a), the switch control signal C1 is at L level within a period up to a time point T1, stays at H level in a period of from time point T1 to time point T8, and becomes L level again after the time point T8.

As for the switch control signal C8, this is at L level in a period up to time point T12, stays at H level in a period from time point T12 to time point T13, and becomes L level after the time point T13.

Shown in FIG. 2(b) are a collector voltage (node-A voltage) of NPN transistor 17, a collector voltage (node-B voltage) of PNP transistor 18, and an output voltage waveform in the case of the switch control signals C1-C8 of (a) being given thereto. The reference voltage is set to zero (0), for example.

As previously stated, in the first push-pull amplifier, when the switch control signals C1-C8 are at H level, their corresponding switches 61-68 turn on.

In FIG. 2, an explanation will first be given while focusing attention on the node A voltage.

Within a period of from time point 0 to time point T1, all of the switch control signals C1-C4 are at L level; so, switches 61-64 are all turned off.

Accordingly, no current flows in DC voltage sources 51-54; instead, current flows in diodes 71-74, resulting in DC voltage source 81's voltage V9 being applied to the node A.

Note that in this embodiment, an explanation thereof assumes that the forward voltage of diodes 71-78 is zero.

Subsequently, within a period of time point T1 to time point T2, only the switch control signal C1 is at H level, with the other switch control signals C2-C4 staying at L level; thus, only the switch 61 turns on.

As the DC voltage source 51 corresponding to switch 61 and the DC voltage source 81 are series-connected, the voltage of node A becomes V9+V1.

That is to say, in short, the voltage of DC voltage source of a circuit block with its switch being turned on is added to the voltage V9 of DC voltage source 81, resulting in this addition-processed voltage being applied to the node A.

Hereinafter, similarly, when the switch control signals C2, C3, C4 become H level at time points T2, T3, T4, the switches 62, 63, 64 turn on in responding thereto, respectively. Thus, the voltages V2, V3, V4 are further added to the voltage of node A.

Furthermore, the switch control signals C4, C3, C2, C1 go to L level at time points T5, T6, T7, T8, causing switches 64, 63, 62, 61 to turn off, respectively; so, the voltage of the node A experiences subtraction of voltages V4, V3, V2, V1 as shown in FIG. 2.

Regarding the voltage of node B also, as in the case of node A, the switches 65-68 controlled by switch control signals C5-C8 are switched to ON or OFF, thereby obtaining a change as shown in FIG. 2. The node-B voltage that varies within the period of from time point T9 to time point T16 is opposite in positive/negative polarities to the node-A voltage in the time period of T1-T8.

[Operation of Switch Control Unit 83: FIGS. 1-2]

Next, an operation of the switch control unit 83 will be explained using FIGS. 1 and 2.

As stated above, the switch control unit 83 changes, based on an envelope signal detected from input signal, the potential level of each of switch control signals C1-C8 to H level or L level and then outputs it.

As a result, the switch control signals C1-C4 for control of switches 61-64 that control the node-A voltage vary when the output waveform is positive.

The switch control unit 83 sets, based on an envelope signal inputted, the switch control signal C1 to H level when the voltage of output waveform is greater than V9.

Additionally, the switch control unit 83 sets the switch control signal C2 at H level when the output waveform voltage is greater than V9+V1, sets switch control signal C3 at H level when the output waveform voltage is greater than V9+V1+V2, and sets switch control signal C4 at H level when the output waveform voltage is larger than V9+V1+V2+V3.

Under the other conditions, switch control unit 83 sets switch control signals C1-C4 at L level.

Similarly, the switch control signals C5-C8 for controlling the switches 65-68 that control the voltage of node B vary when the output waveform is negative.

The switch control unit 83 sets, based on an envelope signal inputted, the switch control signal C5 to H level when the voltage of an output waveform is less than −V10, sets the switch control signal C6 to H level when the voltage of output waveform is less than −V10−V5, sets switch control signal C7 to H level when the output waveform voltage is less than −V10−V5−V6, and sets switch control signal C8 to H level when the output waveform voltage is less than −V10−V5−V6−V7.

Under the other conditions, switch control unit 83 sets switch control signals C5-C8 to L level.

The switch control unit 83 is arranged so that switch control signals C1-C8 operate under these conditions and is readily realizable using a comparator circuit. This comparator circuit may be designed to have hysteresis characteristics.

As shown in FIG. 1, in the first push-pull amplifier, the switch control unit 83 is designed in view of the gain of an output level with respect to input level in order to generate switch control signals C1-C8 from an envelope signal inputted from input terminal 8.

The voltages V1 to V10 of respective DC voltage sources may be set to the same voltage value or, alternatively, may be set at different voltage values.

Further note that although the voltages of nodes A and B are each arranged here to vary in five steps, it is permissible to modify it to have other numbers of steps.

Furthermore, although in the first push-pull amplifier the output waveform is compared with a threshold value which was applied addition or subtraction in combination of V9, V1, V2, V3, V4 or V10, V5, V6, V7, V8 to thereby determine the level of each switch control signal (H or L), it is not always necessary to do so.

[Efficiency of First Push-Pull Amplifier: FIG. 3]

Next, the efficiency of the first push-pull amplifier will be explained using FIG. 3. FIG. 3 is an explanatory diagram showing power conversion efficiency characteristics of the first push-pull amplifier.

As previously stated, in the first push-pull amplifier, the collector terminal (node A voltage) of NPN transistor 17 and the collector terminal (node B) voltage of PNP transistor 18 vary in compliance with the output waveform.

In other words, the voltages of nodes A and B are controlled to also make the absolute value of the collector terminal voltage small when the output waveform is small, whereby the first push-pull amplifier operates in a state close to saturation output at all times.

Consequently, as shown in FIG. 3, the power conversion efficiency of first push-pull amplifier increases when compared to the prior art approach shown in FIG. 14. Especially, at an output lower than the saturation output, efficiency improvement is notable.

For example, the power conversion efficiency at the time of backoff=−8 dB corresponding to OFDM signal is improved to 55% in the first push-pull amplifier although the same was 30% in the conventional push-pull amplifier of FIG. 14.

[Configuration of DC Voltage Source Circuit: FIG. 4]

An explanation will next be given, using FIG. 4, of a configuration of the DC voltage source circuit which supplies DC voltage to the collector terminal of NPN transistor 17 or PNP transistor 18. FIG. 4 is a block diagram showing a configuration example of the DC voltage source circuit that supplies DC voltage to the collector terminal of NPN transistor 17. Note that the same reference numerals are assigned to portions corresponding to the DC voltage sources 51-54 shown in FIG. 1.

Although only the DC voltage source circuit on NPN transistor 17's side is explained here, the DC voltage source circuit on PNP transistor 18's side is also similar in configuration.

As has been shown in FIG. 1, the DC voltage sources 51-54 and DC voltage source 81 are series-connected when switches 61-64 are driven to turn on; DC voltage sources 55-58 and DC voltage source 82 are series-connected when switches 65-68 turn on. Thus, it is necessary to employ an insulated power supply design.

As shown in FIG. 4, the DC voltage source circuit of first push-pull amplifier includes an input terminal 201 for feeding power supply, a smoothing circuit 202 which performs smoothing of the power supply voltage fed from input terminal 201, a switch circuit 203, a transformer 204 for electrical isolation between an input and a plurality of outputs, rectification/smoothing circuits 205-208 which perform output-voltage rectification and smoothing, an error amplifier 209 which detects an error from a target output voltage, a photocoupler 210 for establishing isolation when passing error information to control circuitry, a control circuit 211 which minimizes the error information to thereby provide control for retention at the target output voltage, and a driver circuit 212 for driving the switch circuit 203.

An operation of the DC voltage source circuit with the above-stated configuration will be explained.

When a voltage Vin is inputted from the input terminal 201, this is smoothed by the smoothing circuit 202 and inputted to the input side of transformer 204 via switch circuit 203.

On the output side of transformer 204, coils are provided which have winding numbers corresponding to the voltage values of respective DC voltage sources 51-54. Voltages converted depending on the winding numbers are applied via rectification/smoothing circuits 205-208, thus becoming output voltages of DC voltage sources 51-54, respectively.

The voltages of DC voltage sources 51-54 are V1-V4, wherein control is provided so that DC voltage source 54 reaches its target voltage V4.

More specifically, the control for setup to target voltage V4 is achieved by monitoring the DC voltage source 54, by inputting an error signal, which is a difference between the voltage of DC voltage source 54 that was detected by error amplifier 209 and the target voltage, to the control circuit 211 via photocoupler 201, and by causing control circuit 211 to vary the duty ratio of a signal for turn-on/off of switch circuit 203 in such a way that the error signal becomes smaller.

Although no monitoring is performed for DC voltage sources 51-53, the winding number of transformer 204 may be designed to ensure that the voltages of DC voltage sources 51, 52, 53 respectively become V1, V2, V3 when the voltage of DC voltage source 54 becomes V4.

Effects of First Embodiment

The power supply circuit according to the first embodiment of the present invention is arranged to include in a push-pull amplifier a first power supply voltage generation circuit configured from a serial connection of plural circuit blocks B1-B4 each having a switch and DC voltage source being series-connected and also having a diode being connected in parallel therewith, and a second power supply voltage generation circuit having a series connection of plural circuit blocks B5-B8, wherein the first power supply voltage generation circuit is connected to the collector terminal of NPN transistor 17 whereas the second power supply voltage generation circuit is connected to the collector terminal of PNP transistor 18 and wherein switch control unit 83 outputs, in response to the envelope signal of an input signal from envelope wave detector 3, switch control signals C1-C8 for control of turn-on/off of switches 61-68 of circuit blocks B1-B8. Accordingly, there are effects of controlling the collector voltages of NPN transistor 17 and PNP transistor 18 depending on the input signal level in such a way as to follow the level of an output signal, making it possible to attain near-saturation operability at all times, improving the power conversion efficiency in the case of low output level of push-pull amplifier, and enabling improvement of the power conversion efficiency of an entirety of the power supply circuit.

A further effect is that use of the first power supply circuit for EER amplifiers, for example, makes it possible to improve the efficiency of the whole amplifier, reduce the power consumption, downsize the heat-radiation fin module, and thus achieve the intended reduction in size and weight.

It is noted that although in the above-stated example the DC voltage sources 81, 82 are respectively arranged to apply its voltages to the nodes A, B at all times, this may be modified so that a switch and diode are added thereto to enable a circuit block to perform on/off-switching operations in a similar manner to other DC voltage sources.

Also note that the configurations of the power supply voltage generation circuits which respectively generate the collector voltages of NPN transistor 17 and PNP transistor 18 are not limited to those shown in FIG. 1 and may be modified to employ any other circuit configurations as far as each of them outputs different voltages depending on control signals from the switch control unit.

Second Embodiment

Next, a power supply circuit in accordance with second embodiment of the present invention will be explained.
[Example of Collector Voltage with Transition Time Ignored: FIGS. 1 and 5]

Prior to explaining the second embodiment in detail, an explanation will be given, using FIGS. 1 and 5, of the relationship of an output signal waveform and collector voltage in a case where the transition time does not exist when the potential of collector voltage transitions from a given level to its next level in the first push-pull amplifier shown in FIG. 1. FIG. 5 is an explanatory diagram showing the relationship of output signal waveform and collector terminal potential in the absence of such transition time.

Note that in FIG. 5, a collector voltage is shown which considers the forward voltage of the diode of each block.

As shown in FIG. 5, a switch control unit 83 outputs switch control signals for turn-on/off of respective switches 61-68 of the above-stated power supply voltage generation circuits based on a magnitude correlation of thresholds Vth1-Vth8 and an output voltage waveform 103 of the push-pull amplifier, which is outputted to the emitter terminals of NPN transistor 17 and PNP transistor 18.

Note that in the circuit configuration of FIG. 1, switch control unit 83 generates, based on the envelope signal of an input signal, each switch control signal adapted for the output-voltage/threshold relationship.

As a result, assuming that there is no transition time in the event of changeover of the collector voltage, the collector voltage of NPN transistor 17 has a waveform indicated by 101 whereas the collector voltage of PNP transistor 18 has a waveform shown by 102.

Here, letting the forward voltages of diodes 71-78 be VF1, VF2, VF3, VF4, VF5, VF6, VF7, VF8 respectively, in one exemplary case where only the switches 61 and 62 shown in FIG. 1 are in the ON state and the other switches are in OFF state, current flows into NPN transistor 17 through DC voltage sources 51, 52, diodes 73, 74 and DC voltage source 81.

The voltage Vc at collector terminal of NPN transistor 17 in this case is given by:

$$Vc=V1+V2+V9-VF3-VF4.$$

Additionally, since NPN transistor 17 and PNP transistor 18 are operating as push-pull circuitry, a potential difference between the collector and emitter terminals of NPN transistor 17 is required to be significant to an extent that NPN transistor 17 is not saturated within a time period in which NPN transistor 17 is operating. Similarly, within an operation period of PNP transistor 18, a potential difference between the collector and emitter terminals of PNP transistor 18 is required to be large sufficiently.

When the potential difference between collector and emitter terminals becomes smaller than the transistor's saturation voltage, the transistor is saturated, resulting in a distortion appearing at a signal outputted from the push-pull amplifier.

Consequently, as shown in FIG. 5, the thresholds (Vth1 to Vth8) for judgment of the level of an output waveform of the push-pull amplifier are set up as follows:

$$Vth1<V9-VF1-VF2-VF3-VF4-Vce(npn:sat),$$

$$Vth2<V9+V1-VF2-VF3-VF4-Vce(npn:sat),$$

$$Vth3<V9+V1+V2-VF3-VF4-Vce(npn:sat),$$

$$Vth4<V9+V1+V2+V3-VF4-Vce(npn:sat),$$

$$Vth5>-V10+VF5+VF6+VF7+VF8+Vce(pnp:sat),$$

$$Vth6>-V10-V5+VF6+VF7+VF8+Vce(pnp:sat),$$

$$Vth7>-V10-V5-V6+VF7+VF8+Vce(pnp:sat),$$

$$Vth8>-V10-V5-V6-V7+VF8+Vce(pnp:sat).$$

Here, Vce(npn:sat) is the collector-emitter voltage for saturation of NPN transistor 17, and Vce(pnp:sat) is the collector-emitter voltage for saturation of PNP transistor 18.

With this approach, even when any collector voltage value is selected by the control signal from switch control unit 83, it is possible to secure the collector-emitter potential differences of NPN transistor 17 and PNP transistor 18 to the extent that no transistor saturation occurs.

[Transition Time of Collector Voltage: FIG. 6]

An explanation will next be given, using FIG. 6, of the transition time of collector voltages applied to the collectors of NPN transistor 17 and PNP transistor 18. FIG. 6 is an explanatory diagram showing the transition time of the collector voltage of NPN transistor 17.

Shown in FIG. 6 are an ideal waveform 111 of the collector voltage of NPN transistor 17 with respect to an output waveform example 113 of push-pull amplifier 12 and an example of actual waveform 112.

In the EER power supply circuit, the collector voltage is forced to change while keeping pace with or "tracking" a change in output waveform 113 of push-pull amplifier 12.

In the example of FIG. 6, control is provided to change, at a time point t, the potential level of collector voltage from Vc(i) to next voltage level Vc(i+1) with an increase in level of output waveform 113 of push-pull amplifier and then change it to the voltage level Vc(i) again in response to a level decrease of output waveform 113.

At time point t, in response to receipt of an instruction from switch control unit 83, one of switches 61-65 changes to its ON state from OFF state, causing the voltage applied to the collector node of NPN transistor 17 to change from Vc(i) to Vc(i+1); in this case, if the transition time for transition of the voltage level is unnecessary, it becomes a stair step-like waveform resembling the ideal signal waveform 111.

However, the actual signal waveform 112 is a response accompanying a finite changeover time (transition time) Δt as shown in FIG. 6. A collector voltage changeover waveform at PNP transistor 18 is an up/down-inverted version of the waveform 112.

[Case of Wideband Signal]

Note here that in cases where the signal inputted to push-pull amplifier 12 is a broadband W-CDMA signal or OFDM signal, it sometimes happens that such signal has steep rising and falling edges as shown by output waveform 113.

In this case, if the collector voltage's changeover is late, a difference between the collector and emitter node potentials of push-pull amplifier goes below the saturation voltage, and then transistor saturation takes place, resulting in undesired generation of a distortion in the output signal waveform of push-pull amplifier 12.

[Shortening Transition Time]

To avoid this, it is necessary to shorten the transition time of the potential level of the collector voltage.

The transition time is determined by response speeds of switches 61-68 and switch control unit 83 and by parasitic capacitance/inductance components inherent to respective parts of circuitry. In view of this, a certain degree of improvement is achievable by optimization of the circuit layout with the use of response speed-enhanced elements and/or parasitic inductance/capacitance-lessened elements.

However, it has been still difficult to sufficiently shorten the transition time in such a way as to enable a response to steep rise-up and fall-down of the envelope signal of wideband signal.

In addition, when an attempt is made to steeply change the voltage level in order to shorten the transition time, the collector voltage can sometimes experience occurrence of the so-called ringing, such as ripping or undulant variations of the amplitude: if such ringing is great, the emitter-collector potential difference becomes smaller, resulting a distortion tending to appear at the output signal.

In short, it has been difficult to sufficiently shorten the transition time of collector voltage while simultaneously letting the ringing stay within an allowable range.

Consequently, in the second embodiment of this invention, a power supply circuit is provided capable of successfully tracking a level change of wideband signal even when the transition time in collector voltage changeover events is a time length which causes the ringing to stay within the allowable range, thereby preventing degradation of the distortion characteristics of output signal.

[Configuration of Second Embodiment: FIG. 7]

The power supply circuit in accordance with the second embodiment of the present invention includes a push-pull amplifier and DC/DC converter in a similar manner to the first power supply circuit.

A configuration of the push-pull amplifier used in the power supply circuit in accordance with the second embodiment of this invention will be explained using FIG. 7. FIG. 7 is a configuration diagram of the push-pull amplifier used in the power supply circuit in accordance with the second embodiment of this invention.

As shown in FIG. 7, the push-pull amplifier (second push-pull amplifier) used in the power supply circuit (second power supply circuit) in accordance with the second embodiment of this invention is similar in basic configuration to the first power supply circuit shown in FIG. 1; so, an explanation will be given by adding the same numerals to the same parts of FIG. 1.

The second push-pull amplifier is characterized by newly having a timing control unit 121; additionally, a configuration and operation of switch control unit 83' are partly different from those of the switch control unit 83 of first push-pull amplifier.

[Operation Summary of Second Push-Pull Amplifier]

Here, an operation of the second push-pull amplifier will be briefly explained.

The second push-pull amplifier is the one that sufficiently delays an input signal by taking into account the transition time of collector voltage to thereby enable the collector voltage to perform tracking successfully even when a wideband signal is inputted.

More precisely, the second push-pull amplifier inputs the inputted signal to operational amplifier 16 after having delayed it by a constant delay time (td) which is greater than the transition time of collector voltage, and causes control signals C1-C8 generated based on a non-delayed input signal to potentially rise with a delay corresponding to a time length (td−Δt) obtained by subtracting the collector voltage transition time (Δt) from the delay time (td).

By this means, switch control signals C1-C8 are outputted at a timing earlier than an output signal at the emitter terminal of transistor by the transition time (Δt), thereby allowing the collector voltage to vary while tracking it even when a steep change occurs in the input signal, thus making it possible to prevent degradation of the distortion characteristics of output signal.

Note that in reality, the transition time of collector voltage is a time which differs per voltage level.

[Each Part of Second Push-Pull Amplifier]

Characteristic part of the second push-pull amplifier will be explained concretely.

[Timing Control Unit 121]

The timing control unit 121 delays a signal inputted from input terminal 8 by a specific preset delay time td and then outputs it to operational amplifier 16.

The delay time td is determined to be a time length which is longer than the transition time at any voltage level of the collector voltage.

Timing control unit 121 corresponds to the timing adjustment unit as claimed.

[Switch Control Unit 83']

Although the switch control unit 83' is the one that generates switch control signals C1-C8 based on an envelope signal inputted from input terminal 8 in a similar way to the switch control unit 83 in the first push-pull amplifier, it delays the switch control signal output (level change) timing when compared to the first push-pull amplifier.

The switch control unit 83' has a comparator circuit which generates switch control signals C1-C8 and, in addition thereto, a control circuit which controls timings of outputting the switch control signals C1-C8 generated. This control circuit is configured from a microcomputer or the like, which has a processing unit and storage unit.

Note that switch control unit 83' corresponds to the control unit as claimed.

An explanation will be given of collector voltages of NPN transistor 17 and PNP transistor 18 which are determined by combinations of levels (high level and low level) of switch control signals C1-C8 from switch control unit 83'.

Considered here are the forward voltages (VF1-VF8) of diodes 71-78 of respective circuit blocks B1-B8.

Letting voltages applied to the collector terminal of NPN transistor 17 in the second push-pull amplifier be given by Vc1-Vc5 and letting voltages applied to the collector terminal of PNP transistor 18 be Vc6-Vc10, the collector voltage levels in the circuit configuration of FIG. 7 have ten stages which follow:

$Vc1 = V9 - VF1 - VF2 - VF3 - VF4,$ $Vc2 = V9 + V1 - VF2 - VF3 - VF4,$ $Vc3 = V9 + V1 + V2 - VF3 - VF4,$ $Vc4 = V9 + V1 + V2 + V3 - VF4,$ $Vc5 = V9 + V1 + V2 + V3 + V5,$ $Vc6 = -V10 + VF5 + VF6 + VF7 + VF8,$ $Vc7 = -V10 - V5 + VF6 + VF7 + VF8,$ $Vc8 = -V10 - V5 - V6 + VF7 + VF8,$ $Vc9 = -V10 - V5 - V6 - V7 + VF8,$ $Vc10 = -V10 - V5 - V6 - V7 - V8.$

As previously stated, the transition time in collector voltage changeover events is different per voltage level. The transition time needed for changeover from voltage level Vc1 to Vc2 is given as Δt1.

Similarly, the transition time of from voltage level Vc2 to Vc3 is given by Δt2; the transition time of from voltage level Vc3 to Vc4 is given as Δt3; the transition time of from voltage level Vc4 to Vc5 is given as Δt4; the transition time of from voltage level Vc6 to Vc7 is given as Δt5; the transition time of from voltage level Vc7 to Vc8 is given as Δt6; the transition time of from voltage level Vc8 to Vc9 is as Δt7; and, the transition time of from voltage level Vc9 to Vc10 is as Δt8.

The values of transition times Δt1, . . . , Δt8 are values determined by the characteristics of push-pull amplifier, characteristics/circuit-constants of respective elements constituting the circuit and further the characteristics of main amplifier 6 of the power amplifier, and is a value prehensible at the design stage.

The switch control unit 83' of second push-pull amplifier prestores respective collector voltage changeover levels (Vc1→Vc2, Vc2→Vc3, ..., Vc9→Vc10) and transition time lengths (Δt1 to Δt8) needed for such potential changes in a one-to-one correspondence manner.

Note here that the transition time is considered only for potential rise-up (switch turn-on) of control signals; any transition time in fall-down events is not considered.

In other words, switch control unit 83' stores, as Δt1-Δt8, the rise-up transition time values of respective switch control signals C1-C8.

One feature of the second push-pull amplifier is that the switch control unit 83' has a table which stores time length (i.e., timing delay time) for delaying the timing for level changeover of switch control signals C1, . . . , C8 with respect to each of collector voltage changeover levels.

Practically, switch control unit 83' performs control based on an input signal to push-pull amplifier 12, it stores timing delay time data in a way corresponding to the magnitude relation of the input signal and a plurality of preset thresholds and the direction of a change in input signal—i.e., the rise-up or fall-down of each of switch control signals C1, ..., C8.

After all, switch control unit 83' stores in its memory the timing delay time for delaying the timing in rise-up and fall-down events with respect to each of switch control signals C1, ..., C8.

The second push-pull amplifier is such that, in the case of rise-up of switch control signal (case of switch turn-on), it stores as the timing delay time a time length (td−Δt) obtained by subtracting a transition time corresponding to each changeover level from the delay time td in timing control unit 121.

Alternatively, in the case of fall-down of switch control signal, it stores as the timing delay time the delay time td in timing control unit 121.

As for the timing delay time of each switch control signal, it will be described later.

[Timing of Switch Control Signal in Second Push-Pull Amplifier: FIG. 8]

Next, the timing of switch control signal in the second push-pull amplifier will be explained using FIG. 8. FIG. 8 is an explanatory diagram showing control timings of switch control signals in the second push-pull amplifier of FIG. 2.

Shown in FIG. 8 are switch control signals C1-C8 in the case of an input signal 131 being inputted from the input terminal 8 of the push-pull amplifier. When switch control signals C1-C8 are at L level, their corresponding switches 61-68 are in OFF state; when switch control signals C1-C8 are at H level, corresponding switches 61-68 are in ON state.

The switch control unit 83' compares input signal 131 with prestored thresholds Vth1-Vth8 to determine each level (H or L level) of switch control signals C1-C8 and outputs at a timing delayed by the timing delay time that is prestored in a way corresponding to the magnitude relation of input signal 131 and threshold and the direction of a change.

As shown in FIG. 8, let a time point at which the signal waveform 131 becomes larger than threshold Vth1 be t1, and let a time point at which it becomes larger than Vth2, Vth3, Vth4 be t2, t3, t4, respectively.

In addition, let a time point at which signal waveform 131 becomes smaller than threshold Vth5 be t9, and let a time point at which it becomes less than Vth6, Vth7, Vth8 be t10, t11, t12, respectively.

When detecting that signal waveform 131 became larger than threshold Vth1 at time point t1, switch control unit 83' sets switch control signal C1 at H level; on this occasion, switch control unit 83' reads from the table a timing delay time corresponding to rise-up event of switch control signal C1 and outputs a signal with its level changed to H level at a timing delayed by this timing delay time from the time point t1.

As stated above, when letting td1 be the timing delay time upon rise-up of switch control signal C1, td1 is a time length defined by subtracting the transition time Δt1 at the rise-up time of switch control signal C1 from the delay time td in timing control unit 121 (i.e., (td1=td−Δd).

Similarly, switch control unit 83' delays switch control signals C2-C4 for changeover of the collector voltage of NPN transistor 17 by delay times td2-td4 from time points t2-t4 respectively and outputs them after having changed the level of each signal from L level to H level.

Switch control unit 83' also delays switch control signals C5-C6 for changeover of the collector voltage of PNP transistor 18 by delay times td9-td12 from time points t9-t12 and then performs level changeover from L level to H level.

Timing delay times of rise-up (L level→H level) and fall-down (H→L level) of respective switch control signals are as follows.

C1 Rising: $td1=td-\Delta t1$,

C2 Rising: $td2=td-\Delta t2$,

C3 Rising: $td3=td-\Delta t3$,

C4 Rising: $td4=td-\Delta t4$,

C4 Falling: $td5=td$,

C3 Falling: $td6=td$,

C2 Falling: $td7=td$,

C1 Falling: $td8=td$,

C5 Rising: $td9=td-\Delta t5$,

C6 Rising: $td10=td-\Delta t6$,

C7 Rising: $td11=td-\Delta t7$,

C8 Rising: $td12=td-\Delta t8$,

C8 Falling: $td13=td$,

C7 Falling: $td14=td$,

C6 Falling: $td15=td$,

C5 Falling: $td16=td$.

Switch control unit 83' has its memory in which the above-stated timing delay times are stored and, in a switch control signal changeover event, outputs an H or L level-changed signal while delaying it by a corresponding timing delay time.

As the input signal 131 given to push-pull amplifier 12 is caused by timing control unit 121 to be delayed by the delay time td and then outputted, the switch control signals are outputted while being delayed by the above-stated timing delay times (td1-td16); thus, in switch control signal rise-up events, it becomes possible to accelerate the changeover timing of a voltage applied to the collector terminal by each transition time relative to the signal waveform at the output terminal of push-pull amplifier.

This makes it possible to lessen the influence of collector voltage changeover transition time at the time of switch control signal rise-up responsive to potential rise-up of the input signal, thereby enabling suppression of degradation of distortion characteristics of output signal.

[Examples of 2nd Push-Pull Amplifier's Input/Output Signal and Collector Voltage: FIG. 9]

Next, a relationship of the second push-pull amplifier's input/output signal and collector voltage will be explained using FIG. 9. FIG. 9 is an explanatory diagram showing the relationship of second push-pull amplifier's input/output signal and collector voltage.

For an input signal 131 of push-pull amplifier shown in FIG. 9(*a*), an output signal 141 is outputted after having been delayed by timing control unit 121 by a predetermined delay time td as shown in (b).

Also note that a collector voltage 142 which is applied to the collector terminal of NPN transistor 17 in the case of the output signal 141 being larger than a reference voltage is caused by a switch control signal which potentially changes with the above-stated timing delay time to perform level changeover at a timing earlier than the output signal 141's arrival at its threshold; therefore, it varies in steps while following a change of output signal 141.

Similarly, a collector voltage 143 which is applied to PNP transistor 18 in the case of the output signal 141 being less than the reference voltage is also caused to vary in steps while keeping track of a change of output signal 141.

Effects of Second Embodiment

The power supply circuit in accordance with the second embodiment of this invention is arranged so that the switch control unit 83' is provided instead of switch control unit 83 of the first power supply circuit, the timing control unit 121 is provided for delaying an input signal by specific delay time td, the switch control unit 83' stores, in a way corresponding to respective switch control signals C1-C8, the transition time Δt taken for level transition of collector voltage of NPN transistor 17 or PNP transistor 18 due to potential rise-up/fall-down of the switch control signals and also stores rise-up/fall-down timing delay time lengths in a way corresponding to respective switch control signals C1-C8. Then, the switch control unit operates in the rise-up event of each of switch control signals C1-C8 to perform H-level changeover with a delay by a degree of the timing delay time (td−Δt) stored in a way corresponding to the switch control signal of interest and operates in the fall-down event of switch control signal to perform L-level changeover with a delay by the timing delay time td from the timing of input signal. Thus, there are advantageous effects, i.e., it is possible to raise the switch control signal at a time point earlier than the signal that was delayed at timing control unit 121 by a time length equivalent to the transition time of the collector voltage at the switch control signal rise-up time, thereby eliminating the influence of the collector voltage transition time and enabling it to track or "trail" any steep rise-up of wideband signals, thus making it possible to improve the distortion characteristics of output signal.

Additionally, by using the second power supply circuit as power supply circuit of ET and EER power amplifiers shown in FIG. 12, it is possible to supply main amplifier 6 with the power supply voltage that successfully tracks the output signal level of main amplifier 6 and further improve the efficiency of an entirety of such ET and EER power amplifiers.

Third Embodiment

A power supply circuit (third power supply circuit) in accordance with a third embodiment of this invention will now be described.

While the third power supply circuit is similar in configuration to the second power supply circuit in that it has a push-pull amplifier and DC/DC converter, the circuit is specifically arranged to arithmetically determine the rise-up changeover timing of switch control signal at switch control unit 83' of the push-pull amplifier (third push-pull amplifier) 12.

[Gradient in Transition State of Collector Voltage: FIG. 10]

First, the gradient in the transition state of collector voltage will be explained using FIG. 10. FIG. 10 is an explanatory diagram in the case of linear approximation of the gradient in the transition state of collector voltage.

As shown in FIG. 10, in a case where the collector voltage potentially changes from a given voltage level Vci to next voltage level Vc(i+1), the resulting waveform does not become a rectangular waveform but becomes moderate rise-up with a transition time Δtj.

In the example of FIG. 10, when the gradient in the transition state of collector voltage is applied linear approximation, the gradient s is represented by:

$$s = (Vc(i+1) - Vci)/\Delta tj.$$

The transition time (Δt) corresponding to the collector voltage changeover level is determined by the push-pull amplifier's characteristics along with respective elements' characteristics and circuit constants as stated supra, and is prestored as a constant in the switch control unit 83'.

Accordingly, gradients s1 to s16 corresponding to collector voltage changeover levels are also constants prestored.

[Operation of Third Push-Pull Amplifier: FIGS. 5, 10 and 16]

Characteristic part of the third push-pull amplifier will be explained using FIG. 5, FIG. 10 and FIG. 16.

As in the explanation of the second push-pull amplifier, voltages to be applied to the collector terminal of NPN transistor 17 or PNP transistor 18 in push-pull amplifier 12 are given as Vc1 to Vc10.

Additionally, time points at which the input signal waveform 131 becomes larger than Vth1 to Vth4 are given by t1 to t4, respectively, while letting time points at which it becomes smaller than Vth5-Vth8 be t9-t12 respectively.

An explanation will be given hereinafter by taking as an example one specific case where the voltage level applied to the collector node of NPN transistor 17 changes from Vc1 to Vc2 for brevity purposes.

First, a given time point contained within a time interval of from a time point t1, at which an input signal becomes larger than the threshold Vth1, to the delay time td and a voltage level at that time are given as the time point tn and voltage level Vn, respectively.

Further, a voltage which becomes a margin for preventing NPN transistor 17 from reaching saturation is given by Vm. This Vm is set to a voltage value larger than the saturation voltage of NPN transistor 17.

And the switch control unit 83' calculates a time point ta(n) by Equation (3) below.

$$ta(n) = (Vc1 - (Vc + Vm))/s1 + tn. \qquad \text{(Eq. 3)}$$

Here, s1 is the linear approximation-processed gradient when the voltage applied to collector terminal changes from Vc1 to Vc2.

Vm is the margin voltage for preventing transistor saturation, with respect to the voltage value Vn of a signal at time point tn.

Briefly, in cases where a change in collector voltage is linearly approximated by a straight line with the gradient s1, the time ta(n) is equivalent to a rise-up timing (time point) of a switch control signal for supplying the collector voltage that prevents transistor saturation with respect to a signal Vn at a given time tn.

[Method of Calculating ta(n): FIG. 16]

Here, a concrete explanation will be given as to a calculation method of the rise-up timing of switch control signal in the third push-pull amplifier.

A method for calculating ta(n) at a given time point to within a period of from time point t1 to t1+td will be explained using FIG. 16. FIG. 16 is an explanatory diagram showing how to obtain the rise-up timing of switch control signal C1 when changing the collector voltage from Vc1 to Vc2.

To simplify the explanation, FIG. 16 shows one case for obtaining ta(n) based on signals at given time points T1, T2, T3 of this interval.

As previously stated, ta(n) is calculated by Equation (3). More specifically, as shown in FIG. 16, ta(n) at each of time points T1, T2, T3 is obtained as a point at which a straight line with gradient s1—this line passes through an addition point (Vn+Vm) of a margin voltage Vm to voltage value V1, V2 or V3 at each time point—intersects with the collector voltage Vc1.

In the example of FIG. 16, for the time point T1, ta(1) is obtained as a cross point of Vc1 and a line with gradient s1 passing through a point (V1+Vm).

Similarly, for time point T2, ta(2) is obtained; for time point T3, ta(3) is obtained.

Then, the switch control unit 83' of third push-pull amplifier specifies ta(2), which is the earliest timing among ta(1) to ta(3), as a Vc1-to-Vc2 changeover timing ta1.

By choosing the earliest timing from among ta(n) values calculated in this way, the collector-applied voltage which is approximated by gradient Si does not go below the signal's voltage Vn, thus enabling prevention of transistor saturation.

Similarly, for changing of each collector voltage level also, changeover timing (ta2, . . . , ta4, ta9, . . . , ta12) at the time of switch control signal rise-up is obtained in compliance with the gradient. Note that ta2 to ta4 are changeover timings in the events for rise-up of switch control signals C2-C4; ta9-ta12 are changeover timings in rise-up events of switch control signals C5-C8.

Note that in the switch control unit 83' of third push-pull amplifier, gradients s1-s4 and s9-s12 are prestored, which are in the case of linearly approximating changes of the collector voltage in respective rise-up events of respective switch control signals. Here, s1-s4 are gradients in rise-up events of switch control signals C1-C4 whereas s9-s12 are gradients in rise-up events of switch control signals C5-C8.

Gradients s1-s4 have the positive polarity; gradients s9-s12 have the negative polarity.

And, in the third push-pull amplifier, the switch control unit 83' compares the voltage of an input signal with the threshold to determine a switch control signal for execution of changeover based on the level of such input signal and the direction of a change, performs the above-stated arithmetic processing in switch control signal rise-up events. The switch control unit performs switch control signal rise-up at a timing earlier than the specific delay time td by a time length equal to a difference between a threshold excess timing and the changeover timing ta1, . . . , ta4, ta9, . . . , ta12.

Basically, in the case of rise-up of switch control signal, the third push-pull amplifier subtracts from the delay time td in timing control unit 121 a time difference between the changeover timing (ta(n)) that was calculated in compliance with the input signal and the gradient of collector voltage transition at each level and the time point at which the input signal exceeds the threshold, and uses the calculated time as the timing delay time of each switch control signal.

Alternatively, in switch control signal fall-down events, a timing delay time is used which is fit with the specific delay time td.

In short, the third push-pull amplifier performs potential rise-up at a timing earlier than the delayed signal in switch control signal rise-up events and, in switch control signal fall-down events, performs fall-down at a timing tuned to the delayed signal.

Namely, the timing delay time lengths of rise-up (L level→H level) and fall-down (H level→L level) of respective switch control signals in the third push-pull amplifier are given as follows:

C1 Rising: $td1 = td - (t1 - ta1)$,

C2 Rising: $td2 = td - (t2 - ta2)$,

C3 Rising: $td3 = td - (t3 - ta3)$,

C4 Rising: $td4 = td - (t4 - ta4)$,

C4 Falling: $td5 = td$,

C3 Falling: $td6 = td$,

C2 Falling: $td7 = td$,

C1 Falling: $td8 = td$,

C5 Rising: $td9 = td - (t9 - ta9)$,

C6 Rising: $td10 = td - (t10 - ta10)$,

C7 Rising: $td11 = td - (t11 - ta11)$,

C8 Rising: $td12 = td - (t12 - ta12)$,

C8 Falling: $td13 = td$,

C7 Falling: $td14 = td$,

C6 Falling: $td15 = td$,

C5 Falling: $td16 = td$.

With this, it is possible to raise the switch control signal at a timing earlier than the push-pull amplifier's output signal that was delayed by td, prevent transistor saturation even in the presence of the transition time of collector voltage, and permit the collector voltage to trail any steep rise-up of an output signal also, thereby enabling improvement of the distortion characteristics in the output signal.

In addition, even when the collector voltage fall-down becomes slower due to the presence of a transition time, a voltage that surpasses the ideal collector voltage waveform is obtained; so, the transistor saturation does not occur in any way.

Effects of Third Embodiment

In the power supply circuit according to the third embodiment of this invention, the switch control unit 83' is arranged to prestore gradients in the case of performing linear approximation of the transition at each level of the collector voltage, compare an input signal with threshold to determine the H/L level of each switch control signal based a resultant magnitude relation and change direction. Then, the power supply circuit arithmetically calculate, in switch control signal rise-up events, the changeover timing ta(n) which is the earliest timing while guaranteeing that the transistor is not saturated by a signal voltage when the collector voltage transitions with the stored gradient, and employ as the switch control signal delay time (timing delay time) a time length obtained by subtracting a difference (t(n)−ta(n)) between a time point t(n) at which the signal exceeds the threshold and the changeover timing from specific delay time (td). Therefore, it is advantageously possible to raise the switch control signal—so as to avoid transistor saturation by taking account of the transition time of collector voltage—early relative to the signal that was delayed by td at timing control unit 121, thereby making it possible to improve the output signal distortion characteristics.

Another advantageous effect of the third power supply circuit is as follows: it determines the timing delay time by computation of ta(n) based on an inputted signal; thus, it is possible to permit the collector voltage to rapidly response to and track any steep rising edges of wideband signals, thereby improving the distortion characteristics.

A further effect of the third power supply circuit lies in its ability to determine the optimum switch turn-on timing in compliance with the actual input waveform signal, thus enabling further improvement of the efficiency.

Another further effect is that it is no need for the memory to prestore the transition time and timing delay time; thus, it is possible to lessen the capacity of such memory.

In addition, the third power supply circuit is specifically arranged so that in switch control signal fall-down events, it performs, without calculating the transition time, potential fall-down of switch control signal at a timing delayed from the timing of input signal by the delay time td, thus making it possible to simplify the processing.

Furthermore, by using the third power supply circuit as power supply circuit of any one of the ET and EER power amplifiers shown in FIG. 12, it is possible to further improve the efficiency of an entirety of power amplifier.

Fourth Embodiment

A power supply circuit (fourth power supply circuit) in accordance with a fourth embodiment of the present invention will be described.

The fourth power supply circuit is the one that determines by arithmetic computation the changeover timing of switch control signal in switch control unit 83' of a push-pull amplifier (fourth push-pull amplifier) 12 not only in rise-up events but also in fall-down events.

Although in the third power supply circuit stated supra potential fall-down is performed at a timing delayed by delay time td in switch control signal fall-down event to thereby acquire a sufficient delay time and thus prevent transistor saturation, the fourth power supply circuit is arranged to further shorten the delay time, thereby forcing the power supply voltage to track the output waveform of push-pull amplifier 12 as much as possible.

The fourth power supply circuit is similar in configuration to the second and third power supply circuits and is partly different from the third power supply circuit in the processing of switch control unit 83'.

The processing in the switch control unit 83' for computing the timing delay time (td(n)) and changeover timing (ta(n)) in switch control signal rise-up event is the same as that of the third push-pull amplifier.

[Operation of Fourth Push-Pull Amplifier: FIG. 17]

A concrete explanation will be given of a calculation method of the timing in switch control signal rise-up event, which is a characteristic part of the fourth push-pull amplifier. FIG. 17 is an explanatory diagram showing how to obtain the fall-down timing of switch control signal C1 in the case of switching the collector voltage from Vc2 to Vc1.

As in the explanation of the second and third push-pull amplifiers, let Vc1 to Vc10 be voltages applied the collector terminal of NPN transistor 17 or PNP transistor 18 in push-pull amplifier 12; let be t1 to t4 be time points at which an input signal waveform becomes larger than Vth1 to Vth4, respectively; let t5-t8 be time points at which the signal becomes smaller than Vth4-Vth1, respectively; let t9-t12 be time points at which the signal is smaller than Vth5-Vth8, respectively; and, let t13-t16 be time points at which it is larger than Vth8-Vth5, respectively.

Additionally the switch control unit 83' of the fourth push-pull amplifier stores, as the gradient corresponding to a changeover level of the collector voltage, a fall-down gradient (s5-s8, s13-s16) in addition to the rise-up gradient.

The fall-down gradient of NPN transistor 17 has the negative sign and is equal to or greater than the gradient in the case of the collector voltage transitioning to a one-step lower level.

The rise-up gradient of PNP transistor 18 has the positive sign.

For simplicity purposes, an explanation will be given hereinafter by exemplifying a case where the voltage level applied to the collector node of NPN transistor 17 changes from Vc2 to Vc1.

The gradient in the case of linear approximation of the transition of collector voltage in this period is given as s5.

As shown in FIG. 17, first of all, a time point at which the input signal becomes smaller than threshold Vth1 (i.e., goes below threshold Vth1) is given by t8.

A given time point involved in a period between an time point t8 and a time point earlier than the time point t8 by a delay time td (i.e., t8−td) is given by tn; a voltage level at that time is given as Vn.

Further, let Vm be a voltage which becomes the margin for deterring saturation of NPN transistor 17.

At a given time point tn in this period, the switch control unit 83' performs the following calculation:

$$ta(n)=(Vc2-(Vn+Vm))/s5+tn.$$

To simplify the explanation, FIG. 17 shows one case where the fall-down timing ta(n) of switch control signal C1 is obtained based on a signal of given time point T1, T2, T3 or T4 in this period.

As shown in FIG. 17, ta(n) at each of time points T1, T2, T3, T4 is obtained as a point at which a straight line with gradient s5 that passes through a point (Vn+Vm) of adding a margin voltage Vm to a corresponding signal voltage value V1, V2, V3 or V4 at the each time point intersects a collector voltage Vc2.

In the example of FIG. 17, for the time point T1, ta(1) is obtained as an intersection of a line with gradient s5—this passes through (V1+Vm)—and Vc2. Similarly, for time point T2, ta(2) is obtained; for time point T3, ta(3) is obtained; for time point T4, ta(4) is gained.

And the switch control unit 83' of fourth push-pull amplifier lets ta(4), which is the latest timing among ta(1) to ta(4), be a Vc2-to-Vc1 changeover timing ta8.

Briefly, when the changeover timing obtained in this way is used to cause the switch control signal of interest to fall down, the transistor is no longer saturated by a signal in this period in the case of the collector voltage falling with a transition time, thereby enabling the collector voltage to track the output signal waveform more successfully.

And, in the fourth push-pull amplifier, the switch control unit 83' compares an input signal voltage with its threshold to determine a switch control signal for execution of changeover based on an input signal level and change direction, performs arithmetic processing in switch control signal rise-up and fall-down events, and performs rise-up of switch control signal at a timing earlier than the specific delay time td by a time length corresponding to a difference between a threshold excess timing and changeover timing ta1, . . . , ta12.

In short, the fourth push-pull amplifier operates in switch control signal rise-up/fall-down events to subtract, from the delay time td in timing control unit 121, a time difference between the changeover timing (ta(n)) that was calculated depending on the input signal and the gradient of the transition of collector voltage at each level and a time point (t(n)) at which the input signal goes over or below the threshold, and employs the calculated time as the timing delay time of each switch control signal.

As stated above, in switch control signal rise-up events, let the earliest timing without transistor saturation be ta(n); in switch control signal fall-down events, let the latest timing with no transistor saturation be ta(n). Accordingly, the time difference (t(n)−ta(n)) is such that the value in rise-up events is larger than a time difference in fall-down events.

More specifically, values of the timing delay time of respective switch control signal rise-up (L level→H level)/fall-down (H level→L level) events in the fourth push-pull amplifier are as follows:

C1 Rising: $td1=td-(t1-ta1)$,

C2 Rising: $td2=td-(t2-ta2)$,

C3 Rising: $td3=td-(t3-ta3)$,

C4 Rising: $td4=td-(t4-ta4)$,

C4 Falling: $td5=td-(t5-ta5)$,

C3 Falling: $td6=td-(t6-ta6)$,

C2 Falling: $td7=td-(t7-ta7)$,

C1 Falling: $td8=td-(t8-ta8)$,

C5 Rising: $td9=td-(t9-ta9)$,

C6 Rising: $td10=td-(t10-ta10)$,

C7 Rising: $td11=td-(t11-ta11)$,

C8 Rising: $td12=td-(t12-ta12)$,

C8 Falling: $td13=td-(t13-ta13)$,

C7 Falling: $td14=td-(t14-ta14)$,

C6 Falling: $td15=td-(t15-ta15)$,

C5 Falling: $td16=td-(t16-ta16)$.

With this, in the fourth push-pull amplifier, the actual input signal-based computation is performed not only in potential rise-up events but also in fall-down events to perform a control signal fall-down operation at a timing earlier than the td-delayed output signal of push-pull amplifier while avoiding transistor saturation, thereby forcing the collector voltage to track the fall-down of output signal as well as the rise-up thereof, thus enabling improvement of the distortion characteristics of output signal.

Effects of Fourth Embodiment

In the power supply circuit according to the fourth embodiment of this invention, the switch control unit 83' is arranged to prestore gradients in the case of linear approximation of rise-up/fall-down transitions at respective levels of the collector voltage, compare an input signal with the threshold to determine the H/L level of each switch control signal based its magnitude relation and change direction. The power supply circuit calculate, in switch control signal rise-up events, the earliest timing that avoids signal voltage-caused transistor saturation, calculate in switch control signal fall-down events the latest timing that avoids signal voltage-caused transistor saturation, let the calculated timing be the changeover timing ta(n). The power supply circuit employs, as the delay time (timing delay time) of switch control signal, a time length obtained by subtracting a difference (t(n)−ta(n)) between a time point t(n) at which the signal exceeds/underruns the threshold and the changeover timing from specific delay time (td). Therefore, it is advantageously possible to perform switch control signal rise-up/fall-down with the optimum delay time by considering the collector voltage transition time for the signal that was delayed by td in timing control unit 121 to thereby enable the collector voltage to track the output signal while preventing transistor saturation, thus making it possible to improve the output signal distortion characteristics.

Especially in the fourth power supply circuit, the optimum switch control signal rise-up/fall-down timing is calculated by arithmetic processing based on the actual input signal; this, it is possible to feed the collector voltage that rapidly follows any steep rise-up and fall-down of wideband signal, thereby enabling improvement of the output signal distortion characteristics while simultaneously improving the power conversion efficiency.

Briefly, in the fourth power supply circuit, it is possible to determine the optimal switch turn-on/off timing in compliance with the actual input signal waveform, thus making it possible to further improve the efficiency.

In addition, by using the fourth power supply circuit as power supply circuit of the ET and EER power amplifiers shown in FIG. 12, it is possible to further improve the efficiency of the power amplifier as a whole.

[Case of Application to Another Push-Pull Amplifier: FIG. 11]

An example which applies a push-pull amplifier with another configuration to the first to fourth power supply circuits stated above will be explained using FIG. 11. FIG. 11 is an explanatory diagram showing a configuration of another push-pull amplifier used in the second power supply circuit.

As shown in FIG. 11, the configuration of another push-pull amplifier is substantially the same as that of the second push-pull amplifier shown in FIG. 7; however, the former is different from the latter in diode connection of the first power supply voltage supplying circuit for supplying the collector voltage to NPN transistor 17 and second power supply voltage supplying circuit for feeding the collector voltage to PNP transistor 18.

The other constituent parts are the same as those of the second push-pull amplifier; operations of the timing control unit 121 and switch control unit 83' are also the same.

The first power supply voltage supplying circuit of another push-pull amplifier has blocks B1-B4 each consisting of serial combination of DC voltage source and switch with a diode being connected in parallel therewith. All of these blocks B1-B4 are not series-connected; but, the cathodes of respective diodes 71-74 are connected together to node 90, which is coupled to the "−" side (negative side) of DC voltage source 81 on NPN transistor 17's side.

Similarly, the second power supply voltage supplying circuit of another push-pull amplifier is arranged so that diodes 75-78 of blocks B5-B8 are connected to node 91, which is coupled to the "+" side (positive side) of DC voltage source 82 on PNP transistor 18's side.

By independently connecting the diode of each block to the collector terminal of NPN transistor 17 or PNP transistor 18 in this way, it is ascertained that even when some of DC voltage sources 51-54 are selected, only one diode is connected. This means that only the forward voltage corresponding to a single diode is subtracted at all times. Thus, it is possible to stabilize the power supplied to NPN transistor 17 and PNP transistor 18.

In other words, according to the configuration of another push-pull amplifier, it is possible to reduce the number of current-flowing diodes. Accordingly, when compared to the case where the current must flow through a plurality of diodes as in the configuration examples of the above-stated embodiments 1-4, it is possible to suppress potential drop otherwise occurring due to the diode's forward voltage, thereby enabling further improvement of the efficiency.

Note that the above-stated another push-pull amplifier is applicable not only to the second power supply circuit but also to the third or fourth power supply circuit.

Also note that when a configuration without the timing control unit 121 is used, resultant circuitry operates in a similar way to the first push-pull amplifier; thus, it offers, in addition to the effects of the first push-pull amplifier, an effect as to forcing the diode's forward voltage to stay constant in any possible state, thereby enabling stabilization of the power supply.

INDUSTRIAL APPLICABILITY

The present invention is adaptable for use in power supply circuits which are used in power amplifiers of transmitters operative to perform radio communications by means of broadband high-frequency signals and are capable of improving the power conversion efficiency.

REFERENCE SIGNS LIST 1, 8 . . . Input Terminal, 2 . . . Divider, 3 . . . Envelope Wave Detector, 4 . . . Power Supply Circuit, 5 . . . RF Limit Amplifier, 6 . . . Main Amplifier, 7, 9, 10 . . . Output Terminal, 11 . . . DC/DC Converter, 12 . . . Push-Pull Amplifier, 13 . . . Switch Element, 14, 20, 21 . . . Diode, 15 . . . Inductance, 16 . . . Operational amplifier, 17 . . . NPN Transistor, 18 . . . PNP Transistor, 19, 22 . . . Resistor, 23, 24, 51, 52, 53, 54, 55, 56, 57, 58, 81, 82 . . . DC Power Supply, 25 . . . Current Detector, 26 . . . Hysteresis Comparator, 61, 62, 63, 64, 65, 66, 67, 68 . . . Switch, 71, 72, 73, 74, 75, 76, 77, 78 . . . Diode, 83, 83' . . . Switch Control Unit, 101, 142 . . . NPN Transistor Collector Voltage, 102, 143 . . . PNP Transistor Collector Voltage, 103, 113, 141 . . . Output Signal, 111 . . . Ideal Waveform, 112 . . . Actual Waveform, 121 . . . Timing Control Unit, 131 . . . Input Signal, 201 . . . Voltage Source, 202 . . . Smoothing Circuit, 203 . . . Switch Circuit, 204 . . . Transformer, 205, 206, 207, 208 . . . Rectification/Smoothing Circuit, 209 . . . Error Amplifier, 210 . . . Photocoupler, 211 . . . Control Circuit, 212 . . . Driver Circuit.

The invention claimed is:

1. A power supply circuit used for power amplification, comprising:
a push-pull amplifier unit for amplifying an input signal by push-pull amplification schemes;
a variable power supply unit for varying by a control signal a voltage level of a power supply voltage to be supplied to said push-pull amplifier unit in response;
a timing adjustment unit for delaying an input signal inputted to said push-pull amplifier unit; and
a control unit for outputting a control signal which controls the voltage level of the power supply voltage based on said input signal,
characterized in that said control unit causes, in a case of rise-up of the control signal, said control signal to rise at an early timing adapted for a transition time of voltage level changeover with respect to a delay time in said timing adjustment unit and, in a case of fall-down of the control signal, causes said control signal to fall at a timing of said delay time.

2. The power supply circuit as recited in claim 1, characterized in that said control unit stores, as a timing delay time, a time length obtained by subtracting a transition time from the delay time at the timing adjustment unit in a way corresponding to voltage level changeover of rise-up and fall-down of the control signal and, in the case of rise-up of the control signal, raises said control signal at a timing which is delayed from the timing of the input signal by said timing delay time.

3. The power supply circuit as recited in claim 1, characterized in that said control unit stores a gradient of voltage level transition corresponding to rise-up changeover of the control signal and calculates, in the case of rise-up of said control signal, a timing for raising said control signal based on a detected input signal and said gradient, thereby causing said control signal to rise at the calculated timing.

4. The power supply circuit as recited in claim 3, characterized in that said control unit stores a gradient of voltage level transition corresponding to fall-down changeover of the control signal and calculates, in the case of fall-down of said control signal, a timing for lowering said control signal based on a detected input signal and said gradient in substitution for lowering the control signal at the timing of the delay time, thereby causing said control signal to fall at said calculated timing.

5. An ET-type power amplifier having the power supply circuit as recited in claim 1, said power amplifier comprising:
an envelope wave detector for performing wave detection of an input signal; and
a main amplifier for amplifying a signal inputted thereto,
characterized in that said power supply circuit is a power supply circuit with a class D circuit being provided at an output stage of the push-pull amplifier unit, for supplying said main amplifier with a power supply voltage adapted for an envelope detected by said envelope wave detector.

6. An EER-type power amplifier having the power supply circuit as recited in claim 1, said power amplifier comprising:
an envelope wave detector for performing wave detection of an input signal;
a main amplifier for amplifying a signal inputted thereto; and
a limit amplifier for limiting an input signal voltage and for outputting it to said main amplifier,
characterized in that said power supply circuit is a power supply circuit with a class D circuit being provided at an output stage of the push-pull amplifier unit, for supplying said main amplifier with a power supply voltage adapted for an envelope detected by said envelope wave detector.

* * * * *